(12) United States Patent
Disegni et al.

(10) Patent No.: US 11,475,960 B2
(45) Date of Patent: Oct. 18, 2022

(54) NON-VOLATILE MEMORY DEVICE WITH A PROGRAM DRIVER CIRCUIT INCLUDING A VOLTAGE LIMITER

(71) Applicants: STMicroelectronics S.r.l., Agrate Brianza (IT); STMicroelectronics International N.V., Geneva (CH)

(72) Inventors: Fabio Enrico Carlo Disegni, Spino d'adda (IT); Laura Capecchi, Vedano al Lambro (IT); Marcella Carissimi, Treviolo (IT); Vikas Rana, Noide (IN); Cesare Torti, Pavia (IT)

(73) Assignees: STMicroelectronics International N.V., Geneva (CH); STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/306,266

(22) Filed: May 3, 2021

(65) Prior Publication Data
US 2021/0366554 A1  Nov. 25, 2021

(30) Foreign Application Priority Data
May 22, 2020 (IT) .......................... 102020000012070

(51) Int. Cl.
*G11C 13/00* (2006.01)
*G11C 16/10* (2006.01)
(Continued)

(52) U.S. Cl.
CPC .............. *G11C 16/102* (2013.01); *G11C 7/06* (2013.01); *G11C 13/003* (2013.01);
(Continued)

(58) Field of Classification Search
CPC ......... G11C 16/102; G11C 7/06; G11C 16/08; G11C 16/24; G11C 16/28; G11C 16/30;
(Continued)

(56) References Cited

U.S. PATENT DOCUMENTS 8,934,280 B1 * 1/2015 Kuo .................... G11C 11/1693
365/163
9,646,692 B1 * 5/2017 Lung .................. G11C 13/0064
(Continued)

FOREIGN PATENT DOCUMENTS

WO       2005117021 A1    12/2005

*Primary Examiner* — Jay W. Radke
(74) *Attorney, Agent, or Firm* — Slater Matsil, LLP

(57) ABSTRACT

An embodiment non-volatile memory device includes an array of memory cells in rows and columns; a plurality of local bitlines, the memory cells of each column being coupled to a corresponding local bitline; a plurality of main bitlines, each main bitline being coupleable to a corresponding subset of local bitlines; a plurality of program driver circuits, each having a corresponding output node and injecting a programming current in the corresponding output node, each output node coupleable to a corresponding subset of main bitlines. Each program driver circuit further includes a corresponding limiter circuit that is electrically coupled, for each main bitline of the corresponding subset, to a corresponding sense node whose voltage depends, during writing, on the voltage on the corresponding main bitline. Each limiter circuit turns off the corresponding programming current, in case the voltage on any of the corresponding sense nodes overcomes a reference voltage.

20 Claims, 9 Drawing Sheets

(51) Int. Cl.
*G11C 7/06* (2006.01)
*G11C 16/08* (2006.01)
*G11C 16/24* (2006.01)
*G11C 16/28* (2006.01)
*G11C 16/30* (2006.01)
*G11C 16/32* (2006.01)

(52) U.S. Cl.
CPC ...... *G11C 13/0004* (2013.01); *G11C 13/0026* (2013.01); *G11C 13/0069* (2013.01); *G11C 16/08* (2013.01); *G11C 16/24* (2013.01); *G11C 16/28* (2013.01); *G11C 16/30* (2013.01); *G11C 16/32* (2013.01); *G11C 2013/009* (2013.01); *G11C 2013/0078* (2013.01)

(58) Field of Classification Search
CPC ... G11C 16/32; G11C 7/12; G11C 2013/0071; G11C 2013/0078; G11C 13/0004; G11C 13/0069; G11C 13/0026; G11C 13/003; G11C 2013/009; G11C 13/004; G11C 2013/0045
See application file for complete search history.

(56) References Cited

U.S. PATENT DOCUMENTS

| | | | |
|---|---|---|---|
| 10,515,697 B1 | 12/2019 | Jain et al. | |
| 2003/0103406 A1* | 6/2003 | Tran | G11C 16/10 365/230.06 |
| 2006/0181932 A1 | 8/2006 | Cho et al. | |
| 2009/0316474 A1* | 12/2009 | Cho | G11C 29/808 365/163 |
| 2010/0118595 A1* | 5/2010 | Bae | G11C 13/0069 365/163 |
| 2010/0131825 A1* | 5/2010 | Kohler | G11C 29/52 714/763 |
| 2010/0265750 A1* | 10/2010 | Yan | G11C 13/0064 365/51 |
| 2011/0310675 A1* | 12/2011 | Nobunaga | G11C 16/0483 365/205 |
| 2013/0033929 A1* | 2/2013 | Kim | G11C 13/0028 365/163 |
| 2013/0117636 A1* | 5/2013 | Kim | G11C 29/04 714/E11.055 |
| 2015/0070970 A1* | 3/2015 | Inaba | G11C 29/50008 365/158 |
| 2015/0243355 A1 | 8/2015 | Lee et al. | |

* cited by examiner

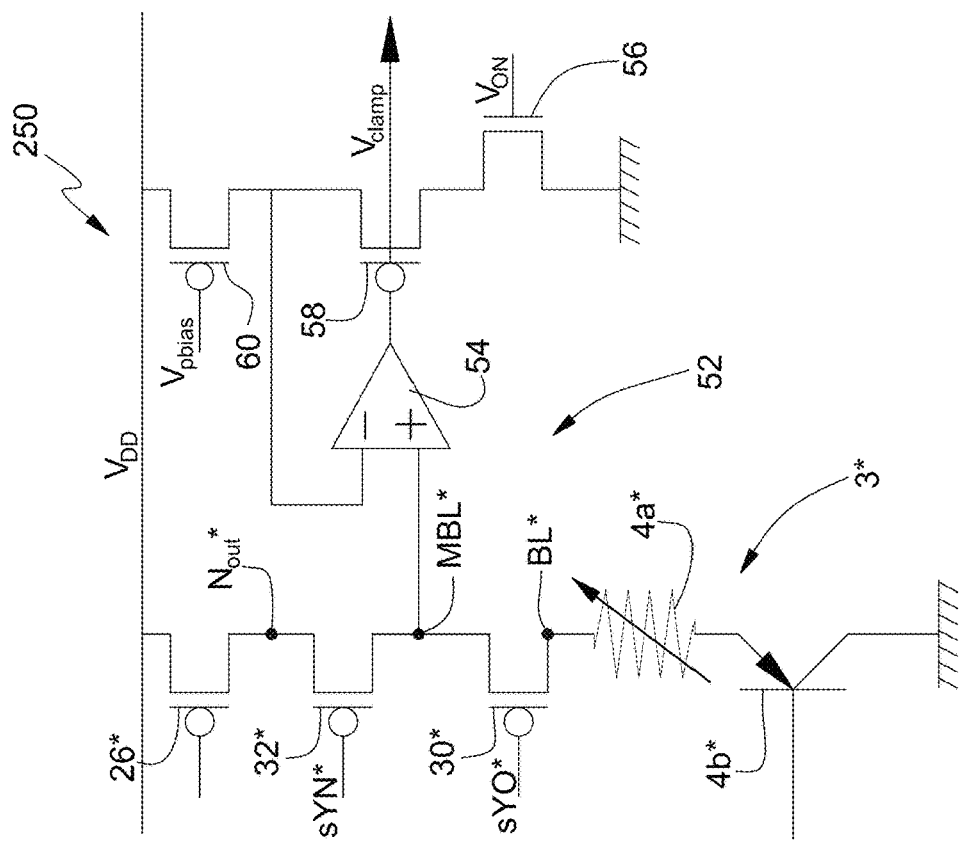
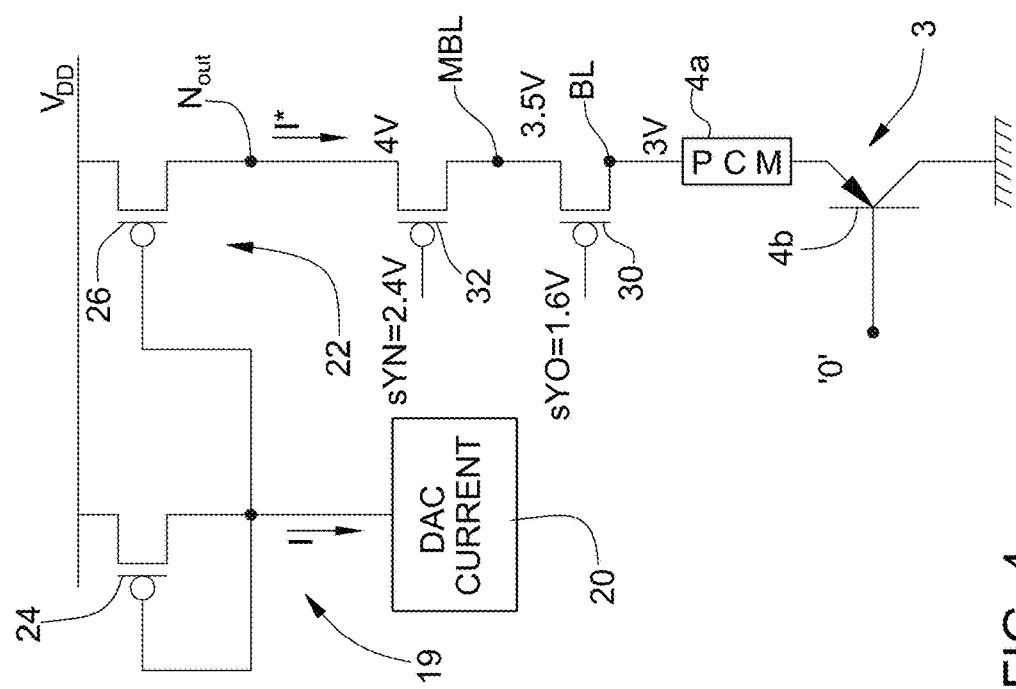
FIG. 7
FIG. 4

NON-VOLATILE MEMORY DEVICE WITH A PROGRAM DRIVER CIRCUIT INCLUDING A VOLTAGE LIMITER

CROSS-REFERENCE TO RELATED APPLICATIONS

This application claims priority to Italian Patent Application No. 102020000012070, filed on May 22, 2020, which application is hereby incorporated herein by reference.

TECHNICAL FIELD

Embodiments of the present invention relate to a non-volatile memory device including a program driver circuit, which includes a voltage limiter.

BACKGROUND

As is known, nowadays non-volatile memories are widely diffused; the non-volatile memories include, as an example, phase-change memories (PCM). In particular, the phase-change memories exploit, in order to store information, the characteristics of materials having the property of switching between phases with different electrical characteristics. These materials may switch between a disorderly/amorphous phase and an orderly, crystalline or polycrystalline phase; different phases are characterized by different values of resistivity and are consequently associated with different values of a datum stored. For instance, it is possible to use elements of Group VI of the periodic table, such as tellurium (Te), selenium (Se), or antimony (Sb), referred to as "chalcogenides" or "chalcogenic materials," to produce phase-change memory elements. In particular, an alloy made up of germanium (Ge), antimony (Sb), and tellurium (Te), known as GST (having chemical composition $Ge_2Sb_2Te_5$) currently finds wide use in such memory cells.

Phase change in a memory element may be obtained by locally increasing the temperature of the cells of chalcogenic material. In particular, when the chalcogenic material of a memory cell is in the amorphous state, and thus has a high resistivity (the so-called RESET state), it is possible to apply to the memory cell a current pulse (or a suitable number of current pulses) of a duration, shape and amplitude so as to enable the chalcogenic material to cool slowly. Subjected to this treatment, the chalcogenic material changes state and switches from the high-resistivity state to a low-resistivity state (the so-called SET state). Conversely, when the chalcogenic material is in the SET state, it is possible to apply a current pulse having an appropriate duration and a large amplitude so as to cause the chalcogenic material to return to the high-resistivity amorphous RESET state.

During reading, the state of the chalcogenic material is detected by applying a voltage sufficiently low so as not to cause meaningful heating thereof, and then reading the value of the current flowing in the memory cell through a sense amplifier. Given that the current is proportional to the conductivity of the chalcogenic material, it is possible to determine in which state the material is, and consequently determine the datum stored in the memory cell.

SUMMARY

An aim of embodiments of the present invention is to provide a non-volatile memory device that will overcome at least in part the drawbacks of the prior art.

According to embodiments of the present invention, a memory device is provided as defined in the annexed claims.

BRIEF DESCRIPTION OF THE DRAWINGS

For a better understanding of the present invention, preferred embodiments thereof will now be described, purely by way of non-limiting example, with reference to the attached drawings, wherein:

FIG. 4 shows a circuit scheme of a portion of the memory device shown in FIGS. 1-3;

FIG. 5-9 show circuit schemes of portions of embodiments of the present memory device.

DETAILED DESCRIPTION OF ILLUSTRATIVE EMBODIMENTS

Figure 1:
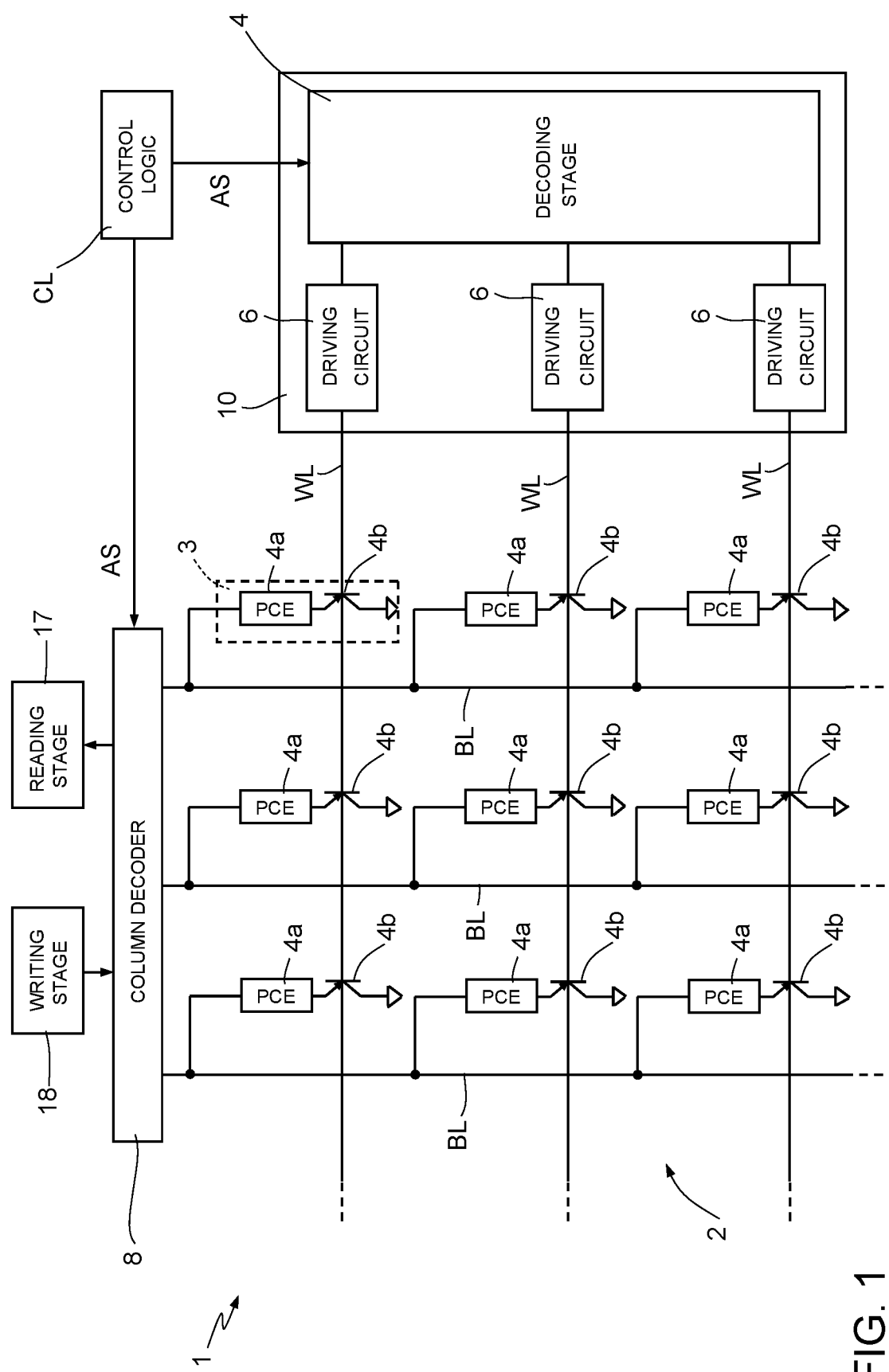
FIG. 1 shows a circuit scheme of a memory device.

FIG. 1 shows a memory device 1 of the PCM type.

The memory device 1 comprises a memory array 2 formed by a plurality of memory cells 3, arranged in rows, or wordlines, and columns, or bitlines. Purely by way of example, illustrated in FIG. 1 are three wordlines, designated by WL, and three bitlines, designated by BL, which enable addressing of nine memory cells 3.

Each memory cell 3 is formed by a storage element 4a, also known as phase-change element (PCE), and by a selector element 4b, which are connected in series between a respective bitline BL and a terminal at a reference potential (for example, ground).

The storage element 4a includes an element made of phase-change material (for example, a chalcogenide, such as GST) and is consequently able to store data in the form of levels of resistance associated to the different phases assumed by the material itself.

The selector element 4b functions as access device and is formed by a bipolar transistor (BJT) of a PNP type, the emitter terminal of which is connected to a first terminal of the storage element 4a, while the base terminal is connected to a corresponding wordline WL. The collector terminal of the bipolar transistor is connected to ground. In this regard, each wordline WL is connected to all the base terminals of the bipolar transistors aligned along the corresponding row. Moreover, each bitline BL is connected to the second terminal of the storage elements 4a aligned along the corresponding column.

In practice, given a memory cell 3, the second terminal of the storage element 4a and the base terminal of the bipolar transistor 4b form, respectively, a bitline terminal and a wordline terminal of the memory cell 3.

The memory device 1 further comprises a column decoder 8 and a row decoder 10, which enable selection of the memory cells 3 on the basis of address signals received at input (designated as a whole by AS). The address signals AS can be generated by a control logic CL, which moreover governs the column decoder 8 and the row decoder 10 so as to enable reading and writing (also known as programming) of the memory cells 3 addressed by the address signals AS. The control logic CL supplies to the column decoder 8 and to the row decoder 10 also control signals in order to govern the reading/writing operations.

The column decoder 8 and the row decoder 10 enable biasing, and hence selection, of the wordlines WL and bitlines BL each time selected so as to select the memory cells 3 connected to them; in this way, reading and writing of the memory cells 3 are enabled.

In greater detail, the row decoder 10 is designed to select, on the basis of the address signals AS, a corresponding wordline WL. The other wordlines WL are de-selected. For this purpose, the row decoder 10 comprises a decoding stage 4 and a plurality of driving circuits 6.

The decoding stage 4 receives the address signals AS and governs the driving circuits 6 according to the address signals AS. Each driving circuit 6 hence has an input, which is connected to the decoding stage 4. Each driving circuit 6 moreover has an output, which is connected to a corresponding wordline WL.

Each driving circuit 6 biases, and hence controls, the base terminals of the bipolar transistors 4b connected to the corresponding wordline WL so as to select/de-select the wordline WL according to the address signals AS.

Column decoder 8 selects, according to the address signals AS, one or more bitlines BL. In practice, the column decoder 8 co-operates with the row decoder 10 in such a way that, during the steps of reading or writing of any memory cell 3 selected, a reading current or a writing current, respectively, flows through the storage element 4a of this memory cell 3. Furthermore, when a memory cell 3 is selected, the base terminal of its bipolar transistor 4b is set at a voltage approximately null; on the contrary, when a memory cell 3 is not selected, the base terminal of its bipolar transistor 4b is set at a positive voltage.

In particular, the column decoder 8 is configured for implementing within it two distinct paths towards the bitlines BL of the memory array 2 each time selected: a reading path, which electrically connects each bitline BL selected to a reading stage 17, during the reading step; and a writing path, which electrically connects each bitline BL selected to a writing stage 18, during the programming step.

The column decoder 8 comprises, for each reading and writing path, appropriate selection elements (in particular, transistors), which are connected so as to implement a hierarchical decoding of the addresses in order to select the memory cells 3.

Figure 2:
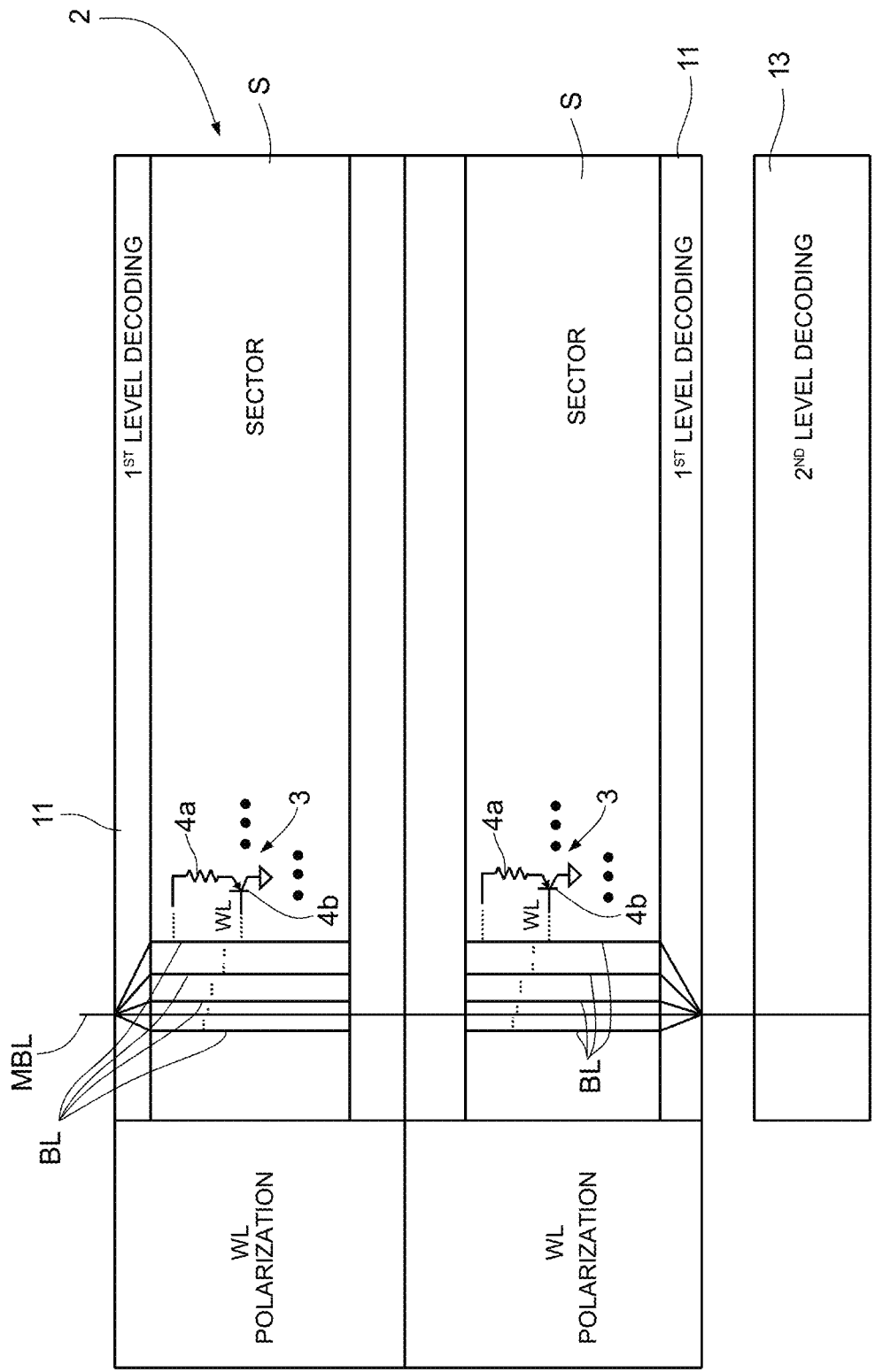
FIGS. 2 and 3 show block diagrams of portions of the memory device illustrated in FIG. 1.

As illustrated schematically in FIG. 2, the memory array 2 is usually organized in a plurality of sectors S, each of which comprises a plurality of memory cells 3. Each sector S includes a plurality of respective wordlines WL and a plurality of respective local bitlines, which are designated once again by BL and are distinct from those of the other sectors. In each sector S, the local bitlines BL are connected to the memory cells 3 of one and the same sector S. In addition, for each set formed by an integer number k (for example, thirty-two) of local bitlines BL, a corresponding main bitline MBL is provided. The main bitlines MBL enable, when selected at a higher hierarchical level, subsequent selection, at a lower hierarchical level, of one or more of the respective local bitlines BL and of the corresponding memory cells 3. In addition, different sectors S are traversed by different wordlines WL.

The main bitlines MBL traverse a certain number of sectors S and can be selected in groups at a hierarchical decoding level even higher than the one associated to selection of the local bitlines BL.

In greater detail, the column decoder 8 comprises: for each sector S, at least one respective first-level decoding circuit (designated by 11 in FIG. 2 and also known as "local column decoder"), which enables connection of the local bitlines BL to the respective main bitlines MBL both during the writing operations and during the reading operations; for each group of sectors S (constituted, in the example of FIG. 2, by two sectors), a respective second-level decoding circuit (designated by 13 and also known as "global column decoder"), which enables selection of the main bitlines MBL both during the writing operations and during the reading operations.

Figure 3:
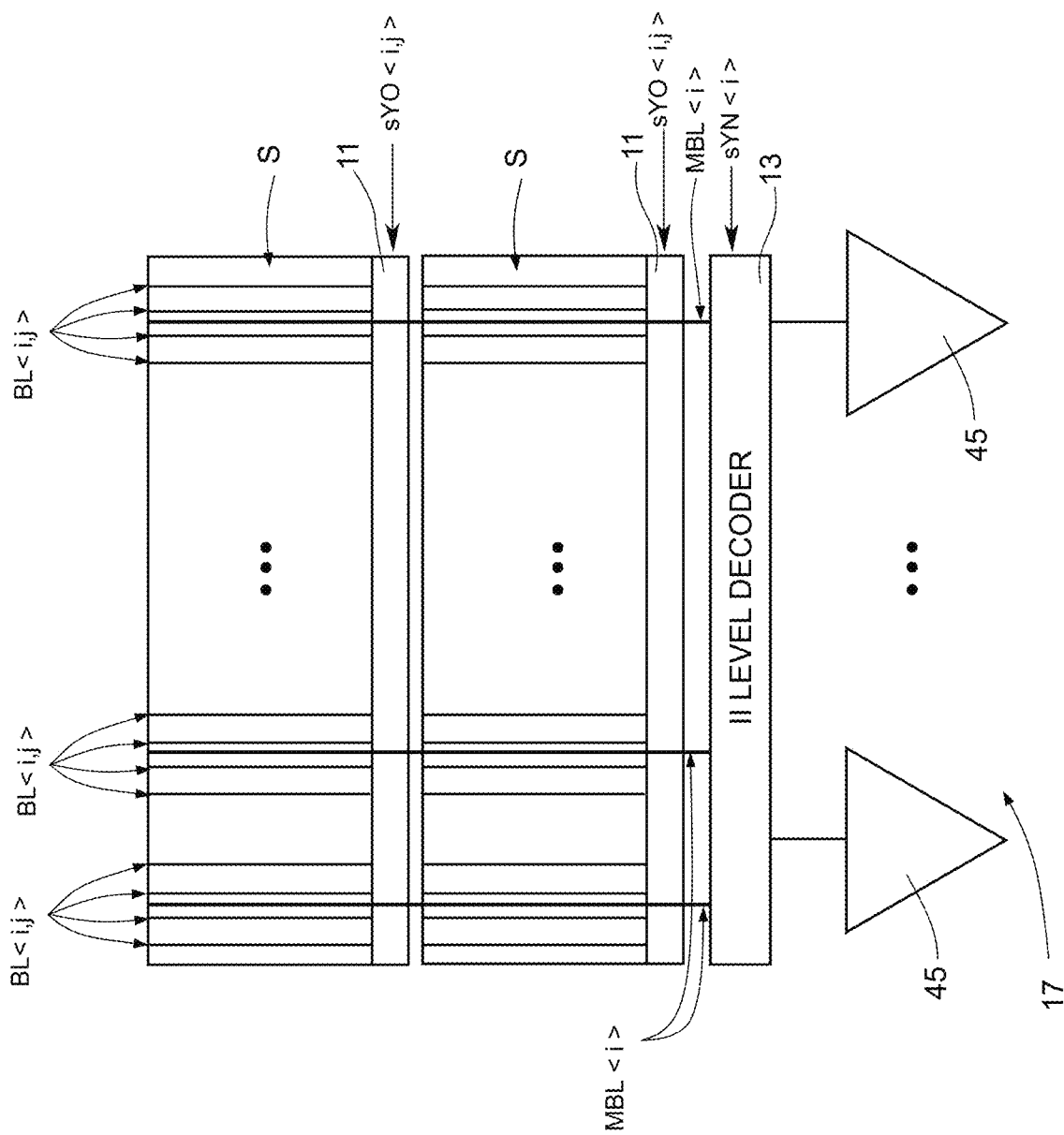

The control logic CL sends to the second-level decoding circuit 13 main column-decoding signals sYN<i>, which are visible in FIG. 3 and form part of the aforementioned address signals AS and on the basis of which the second-level decoding circuit 13 activates an electrical path between a main bitline (here designated by MBL<i>) selected and a sense amplifier 45 of the reading stage 17, via activation of a respective main selection switch (not illustrated).

As mentioned previously, FIG. 3 moreover shows how, given each sector S, each main bitline MBL<i> is associated, i.e., electrically coupleable, to a corresponding set of local bitlines, designated by BL<i,j>. It should be noted that, for simplicity, in FIG. 3 the main bitlines are all denoted by MBL<i>, even though in actual fact the value of the index "i" varies; likewise, the local bitlines are all denoted by BL<i,j>, even though in actual fact the index "i" depends upon the index of the main bitline to which the local bitline can be coupled, and the index "j" ranges between 0 and k−1, for each value of the index "i".

Furthermore, given a sector S, the corresponding first-level decoding circuit 11 is able to address each memory cell 3 coupled to a local bitline BL<i,j> of the sector S thanks to the presence of local selection switches, which are driven by respective local column-decoding signals sYO<i,j>, which are generated by the control logic CL and also form part of the aforementioned address signals AS. It should be noted that, for simplicity, in FIG. 3 the two groups of local column-decoding signals with which the two first-level decoding circuits 11 are supplied for the two sectors S illustrated herein are both denoted by sYO<i,j>, even though in actual fact they are different, since the control logic CL does not simultaneously select local bitlines belonging to different sectors.

During the step of writing, the first-level decoding circuit 11 and the second-level decoding circuit 13 function in the same way as the one described with reference to FIGS. 2 and 3, so as to connect the selected memory cells 3 to circuits of the writing stage 18, which are known as program driver circuits. The program driver circuits are configured to inject suitable programming currents into the selected memory cells 3. Furthermore, in general the abovementioned switches of the first-level decoding circuit 11 and of the second-level decoding circuit 13 used during the step of reading may be used also during the step of writing, possibly adapting the dynamic range of the abovementioned main column-decoding signals sYN<i> and of the local column-decoding signals sYO<i,j>. As an alternative, the first-level decoding circuit 11 and the second-level decoding circuit 13 may use, during the step of writing, switches other than the ones used during the step of reading.

In greater detail, FIG. 4 shows a portion of the writing stage 18, which includes a program driver circuit 19 and a current programming circuit 20.

The program driver circuit 19 comprises a current mirror 22, which in turn comprises a first and a second mirror transistor 24, 26, which are P-channel enhancement MOS transistors and have source terminals connected to a supply node, which is set, in use, at a supply voltage $V_{DD}$, as an example equal to 5V. Furthermore, the gate terminal of the first mirror transistor 24 is connected to the drain terminal of the first mirror transistor 24, which in turn is connected to the current programming circuit 20, so as to supply a preliminary programming current I, which is drawn by the current programming circuit 20; the preliminary programming current I is directed towards the current programming circuit 20 and is of the pulsed type. The gate terminal of the second mirror transistor 26 is connected to the drain terminal of the first mirror transistor 24, in a manner such that, in use, a programming current I* flows in the second mirror transistor 26, which is equal to w times I, wherein w is the mirroring ratio of the current mirror 22; as an example, w may be equal to ten.

The drain terminal of the second mirror transistor 26 forms an output node $N_{out}$ of the program driver circuit 19, which is coupled, during the step of writing, to the memory cell 3 which has to be written, i.e., to the selected memory cell 3, which is connected to the selected wordline WL and to the selected local bitline BL. For instance, the coupling occurs through interposition of a local selection transistor 30 and a main selection transistor 32, which are P-channel enhancement MOS transistors, are connected in series and form, respectively, the first-level decoding circuit 11 and the second-level decoding circuit 13.

In particular, the drain terminal of the local selection transistor 30 is connected to the local bitline BL connected to the memory cell 3, and thus it is connected to the second terminal of the storage element 4a of the memory cell 3. The source terminal of the local selection transistor 30 is connected to the main bitline MBL relating to the abovementioned local bitline BL, and thus it is connected to the drain terminal of the main selection transistor 32. The source terminal of the main selection transistor 32 is connected to the output node $N_{out}$, whose voltage is equal, as an example, to 4V, because of the voltage drop along the column caused by the programming current I*. The gate terminals of the local selection transistor 30 and of the main selection transistor 32 receive, respectively, a corresponding local column-decoding signal (for brevity designated by sYO) and a corresponding main column-decoding signal (for brevity designated by sYN), which, during the step of writing, assume both the logic value '0' and have voltages which, as an example, are respectively equal to 1.6V and 2.4V. Because of the abovementioned voltage drop, the voltages on the main bitline MBL and on the local bitline BL may thus be respectively equal to, as an example, 3.5V and 3V.

In practice, it happens that the so-called gate-source voltage $V_{gs}$ and gate-drain voltage $V_{gd}$ stay below 2V both in the case of the local selection transistor 30 and the case of the main selection transistor 32, thanks to the values of the abovementioned voltages present on the gate terminals. Assuming that the local selection transistor 30 and the main selection transistor 32 are formed by means of a technology such that the corresponding oxides are able to withstand a voltage up to 2V, they are not at risk of being damaged.

Unfortunately, it is known that, following the occurrence of writing cycles, so-called "open bits" may appear in the memory array 2, i.e., it may happen that one or more memory cells 3 get damaged, in which case the corresponding storage elements 4a permanently behave like an open circuit, thereby preventing the current from flowing through the memory cells 3. In this case, it occurs that the programming current I* cannot flow any more through the second mirror transistor 26, the local selection transistor 30 and the main selection transistor 32, which are off. Furthermore, the source and drain terminals of the local selection transistor 30 and of the main selection transistor 32, and thus also the main bitline MBL and the local bitline BL, are set at a voltage approximately equal to the supply voltage $V_{DD}$.

Since the gate terminals of the local selection transistor 30 and of the main selection transistor 32 are still set at, respectively, the abovementioned voltages equal to 1.6V and 2.4V, it happens that, both in the local selection transistor 30 and in the main selection transistor 32, the gate-source voltage $V_{gs}$ and the gate-drain voltage $V_{gd}$ overcome 2V, with a consequent increase of the risk of damaging the local selection transistor 30 and the main selection transistor 32.

In other words, in the presence of open bits, an increase of the voltage occurs in the column decoder 8, concurrently with the generation of the pulses of the preliminary programming current I, with consequent generation of the so-called overvoltage stress on the transistors of the column decoder 8. That entails a reduction of the reliability of the column decoder 8.

Figure 5:
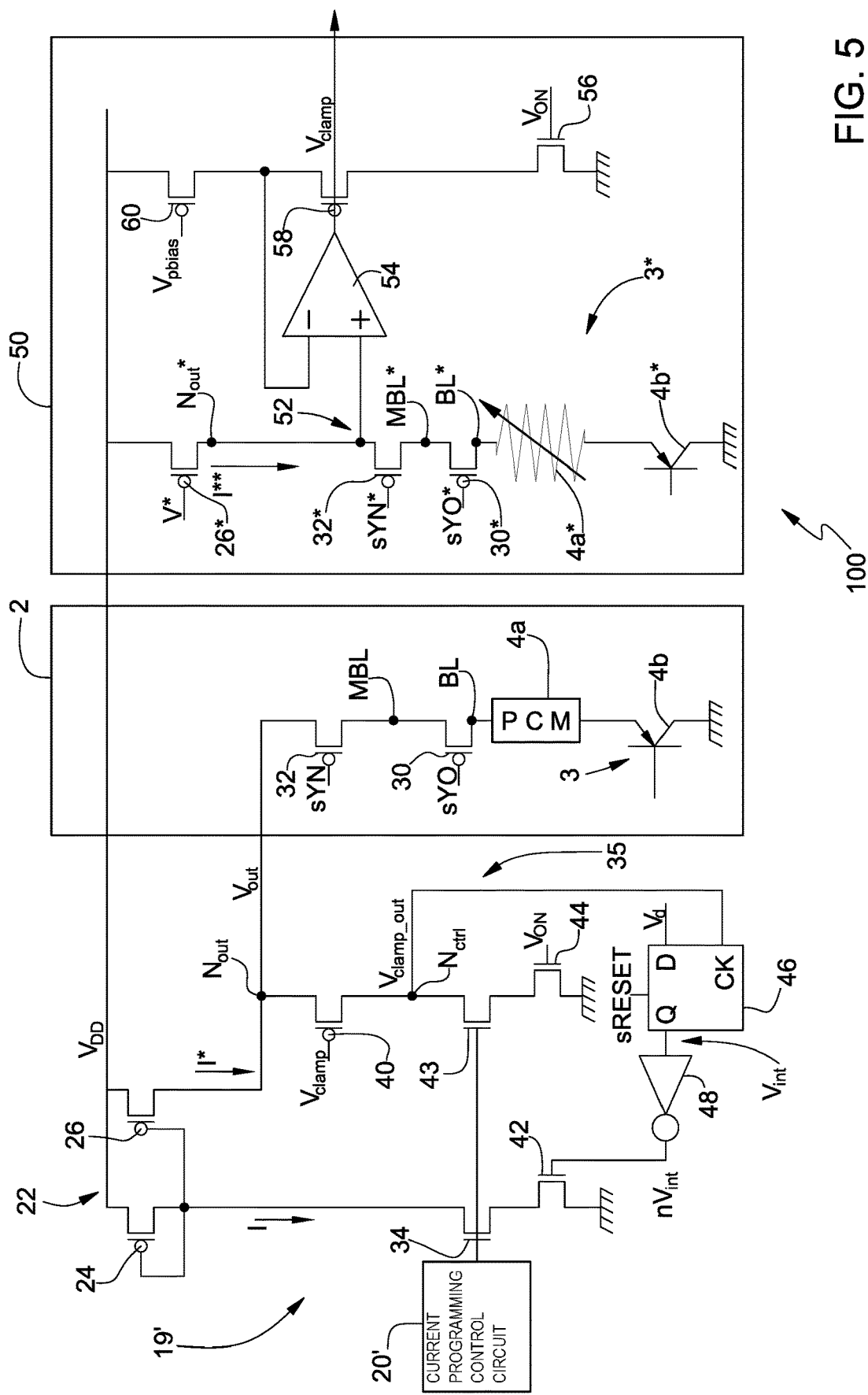

FIG. 5 shows a memory device 100, which will be described with reference to the differences with respect to the memory device 1 of FIGS. 1-4, unless otherwise specified. Furthermore, elements already present in the memory device 1 will be designated by means of the same reference signs, unless otherwise specified.

In detail, the program driver circuit, designated by 19', comprises a current generator transistor 34, which is a N-channel enhancement MOS transistor. The gate and drain terminals of current generator transistor 34 are respectively connected to the current programming control circuit (here designated by 20') and to the gate terminals of the first and second mirror transistors 24, 26. The current programming circuit 20' is configured to control the gate terminal of the current generator transistor 34 so that this latter is traversed by the abovementioned preliminary programming current I.

In addition, the program driver circuit 19' comprises a limiter circuit 35, which includes a limiting transistor 40, which is a P-channel enhancement MOS transistor. The limiter circuit 35 further includes a control transistor 42 and a first and a second additional transistors 43, 44, which are N-channel enhancement MOS transistors, as an example equal to the current generator transistor 34. The limiter circuit 35 further includes a flip-flop circuit 46 and an inverter circuit 48.

In detail, the source terminal of the limiting transistor 40 is connected to the output node $N_{out}$ of the program driver circuit 19', whereas its drain terminal forms a control node $N_{ctrl}$ and is connected to the drain terminal of the first additional transistor 43. A voltage $V_{clamp}$ is present on the gate terminal of the limiting transistor 40; the voltage $V_{clamp}$ is generated by a threshold generator circuit 50 of the memory device 100, described in greater detail below. In addition, a voltage $V_{clamp\_out}$ is present on the control node $N_{ctrl}$.

The gate terminal of the first additional transistor 43 is connected to the current programming control circuit 20', whereas the source terminal of the first additional transistor 43 is connected to the drain terminal of the second additional transistor 44, the source terminal of which being connected to ground. The gate terminal of the second additional transistor 44 is set at a voltage $V_{ON}$, which is generated by the control logic CL. In particular, as described in greater detail below, when, during a writing step, the protection conferred by the limiter circuit 35 is intended to be used, the voltage $V_{ON}$ is set to the logic value '1', so that the second additional transistor 44 is on. To this regard, in the following description, reference will be made to the case in which the limiter circuit 35 is kept functioning, unless otherwise specified.

The clock input of the flip-flop circuit 46 is connected to the control node $N_{ctrl}$, so that the output terminal Q of the flip-flop circuit 46 is controlled by the voltage $V_{clamp\_out}$. The data input terminal of the flip-flop circuit 46 is set at a secondary supply voltage $V_d$, as an example equal to 1V. The reset input terminal of the flip-flop circuit 46 may be controlled by a signal sRESET generated by the control logic CL. The output terminal Q of the flip-flop circuit 46 is connected to the input of the inverter circuit 48, the output of which is connected to the gate terminal of the control transistor 42; the drain terminal of the control transistor 42 is connected to the source terminal of the current generator transistor 34, whereas the source terminal of the control transistor 42 is connected to ground.

The threshold generator circuit 50 includes a dummy circuit 52, which includes a dummy local selection transistor 30*, a dummy main selection transistor 32*, a dummy main bitline MBL*, a dummy local bitline BL* and a dummy memory cell 3*, which are arranged in the same way as, respectively, the local selection transistor 30, the main selection transistor 32, the main bitline MBL, the local bitline BL and the memory cell 3, but for the fact that the dummy cell 3*, besides including a dummy bipolar transistor 4b* which is equal to the bipolar transistors 4b, includes a dummy storage element which is formed by a resistor 4a*.

In addition, the threshold generator circuit 50 further comprises a dummy mirror transistor 26*, which may be equal to the second mirror transistor 26. Furthermore, a voltage V* is set on the gate terminal of the dummy mirror transistor 26*, whereas the source terminal of the dummy mirror transistor 26* is set at the supply voltage $V_{DD}$. The drain terminal of the dummy mirror transistor 26* forms a dummy output node $N_{out}$*, which is connected to the source terminal of the dummy main selection transistor 32*.

The voltages on the gate terminals of the dummy local selection transistor 30* and the dummy main selection transistor 32* are respectively designated by sYO* and sYN*; they are respectively equal to the voltages of the main column-decoding signals sYN and of the local column-decoding signals sYO when these latter respectively select the corresponding main bitlines MBL and the corresponding local bitlines BL during the writing operations. In addition, the base terminal of the dummy bipolar transistor 4b* is set at the same voltage present on the selected wordline WL (e.g., it is set to ground).

The threshold generator circuit 50 further comprises an operational amplifier 54, a third additional transistor 56, an output transistor 58 and a bias transistor 60.

The output transistor 58 and the bias transistor 60 are P-channel enhancement MOS transistors; furthermore, the output transistor 58 is equal to the limiting transistor 40. The source terminal of the bias transistor 60 is set to the supply voltage $V_{DD}$, whereas the drain terminal of the bias transistor 60 is connected to the negative input terminal of the operational amplifier 54, the positive input terminal of which is connected to the dummy output node $N_{out}$*. The gate terminal of the bias transistor 60 is set at a voltage $V_{pbias}$, which may be linked to the voltage present on the gate terminal of the first additional transistor 43. As an example, the voltage $V_{pbias}$ may be such that the bias transistor 60 is on, and the current which flows through the bias transistor 60, and thus through the output transistor 58, is equal to, purely as an example, half the current which flows in the first additional transistor 43. In any case, the precise value of the current flowing in the bias transistor 60 is irrelevant.

The source terminal of the output transistor 58 is connected to the drain terminal of the bias transistor 60, and thus also to the negative input terminal of the operational amplifier 54. The gate terminal of the output transistor 58 is connected to output terminal of the operational amplifier 54. The drain terminal of the output transistor 58 is connected to the drain terminal of the third additional transistor 56. The source terminal of the third additional transistor 56 is connected to ground, whereas the gate terminal of the third additional transistor 56 is set to the voltage $V_{ON}$, so that the third additional transistor 56 is on during writing, if the open bit detection is being carried out.

From an operative point of view, the operational amplifier 54 implements a voltage follower scheme and generates, on its output terminal, the voltage $V_{clamp}$, which controls the limiting transistor 40.

In addition, the voltage V* is generated by means (as an example) of a dedicated current mirror (not shown; as an example, formed within the current programming circuit 20'), so that a dummy current I** flows through the dummy mirror transistor 26*, the dummy main selection transistor 32*, the dummy local selection transistor 30* and the resistor 4a*. Furthermore, the voltage V* may be set equal to a value such that the dummy current I is equal to the maximum current which, during any writing operation (i.e., either of the set type or the reset type), flows in the memory cell 3 to be written, in the absence of open bit. As an example, the dummy current I may be equal to the maximum current which, during a reset operation, flows in the memory cell 3 to be written, in case the reset operation requires an higher current than the set operation.

This having been said, it is possible to demonstrate that the following equation holds:

$$V_{clamp}=V_{be}+R*(I**)+V'+V''-V_{th}$$

wherein: $V_{be}$ is the emitter-base voltage of the dummy bipolar transistor 4b*; R is the resistance of the resistor 4a*; I** is the abovementioned dummy current; V' is the source-drain voltage of the dummy local selection transistor 30*; V'' is the source-drain voltage of the dummy main selection transistor 32*; and $V_{th}$ is the threshold voltage of the output transistor 58.

Given that each storage element 4a has a value of resistance which varies during the writing step (because of the melting of the phase-change material), the value of the resistance R of the resistor 4a* may be set equal to the greatest value of resistance which can be assumed by the storage elements 4a during any writing step (i.e., considering either the set operation and the reset operation).

Without any loss of generality, the memory device 100 includes, for each main bitline MBL, a corresponding program driver circuit 19'; the program driver circuits 19' share the current programming circuit 20' and the threshold generator circuit 50. In addition, the threshold generator circuit 50 generates the voltage $V_{clamp}$ in a manner such that the sum of the voltage $V_{clamp}$ and the threshold voltage $V_{th}$ of the output transistor 58 simulates the greatest allowed voltage on the output node $N_{out}$ in the absence of the open bit.

This having been said, referring to the program driver circuit 19' shown in FIG. 5, and assuming that the control logic CL has performed a reset of the flip-flop circuit 46 through the signal sRESET, so that the output terminal Q is set to '0', the following occurs.

By referring to the voltage on the output terminal Q of the flip-flop circuit 46 as the voltage $V_{int}$, this voltage $V_{int}$ is set to '0', as explained before. Therefore, the voltage on the output of the inverter circuit 48 (hereinafter referred to as $nV_{int}$) is set to '1', thus the control transistor 42 is above threshold; as a consequence, the preliminary programming current I flows in the current generator transistor 34 and the programming current I* is injected by the second mirror transistor 26 into the output node $N_{out}$. Furthermore, the dummy current I** flows in the resistor 4a*.

By referring to the voltage $V_{out}$ to designate the voltage on the output node $N_{out}$, the limiting transistor 40 is off, as long as the voltage $V_{out}$ is lower than $V_{clamp}+V_{th40}$, with $V_{th40}$ which designates the threshold voltage of the limiting transistor 40, which is equal to the abovementioned voltage $V_{th}$. Therefore, the voltage $V_{clamp}+V_{th40}$ is equal to the greatest voltage which should be present on the output node $N_{out}$ in the absence of the open bit.

In view of the above, when the memory cell 3 functions properly (i.e., there is no open bit), the limiting transistor 40 is off, because the voltage on the main bitline MBL and on the local bitline BL is limited, as explained with reference to FIG. 4. Therefore, since the first and the second additional transistors 43, 44 are above threshold, the control node $N_{ctrl}$ is connected to ground, and the voltage $V_{clamp\_out}$ is equal to '0', i.e., it stays constant, at a value nearly equal to 0V. Consequently, the voltage $V_{int}$ on the output terminal Q of the flip-flop 46 remains equal to '0', and the voltage $nV_{int}$ remains equal to '1'.

On the contrary, in case an open bit occurs in the memory cell 3, the voltage $V_{out}$ tends to rise, because, as explained with reference to FIG. 4, the voltages on the main bitline MBL and on the local bitline BL tend, in the absence of any countermeasure, to assume a voltage nearly equal to the supply voltage $V_{DD}$. Therefore, the voltage $V_{out}$ overcomes the voltage $V_{champ}+V_{th40}$, and the limiting transistor 40 turns on. Consequently, the voltage $V_{clamp\_out}$ becomes equal to '1', thereby causing a switching of the voltage $V_{int}$ on the output terminal Q of the flip-flop 46, which becomes equal to T. In turn, such a switching causes a switching of the logic value of the voltage $nV_{int}$ on the output terminal of the inverter circuit 48, which becomes equal to '0'. The control transistor 42 thus turns off, thereby turning off also the preliminary programming current I and the programming current I*. Therefore, the duration of the pulse of the programming current I* is reduced, as an example to no more than 10 nanoseconds, so as to reduce the duration of the time interval in which the voltages on the main bitline MBL and on the local bitline BL can put at risk the local selection transistor 30 and the main selection transistor 32. In such a way, the local selection transistor 30 and the main selection transistor 32 are protected, also in case of occurrence of an open bit in the memory cell 3.

From another point of view, the voltage Vclamp_out results from the comparison between the current flowing through the first additional transistor 43 and the current flowing through the limiting transistor 40, this latter being substantially equal to the current flowing through the output transistor 58 and being thus set by the voltage Vpbias, so that the ratio between the abovementioned currents flowing through the first additional transistor 43 and the limiting transistor 40 falls within a predetermined range (e.g., between 0.1 and 10). This having been said, if the current flowing through the first additional transistor 43 is respectively greater than, or lower than, the current flowing through the limiting transistor 40, the voltage Vclamp_out is respectively equal to the logic value '0' or to the logic value '1'.

Figure 6:
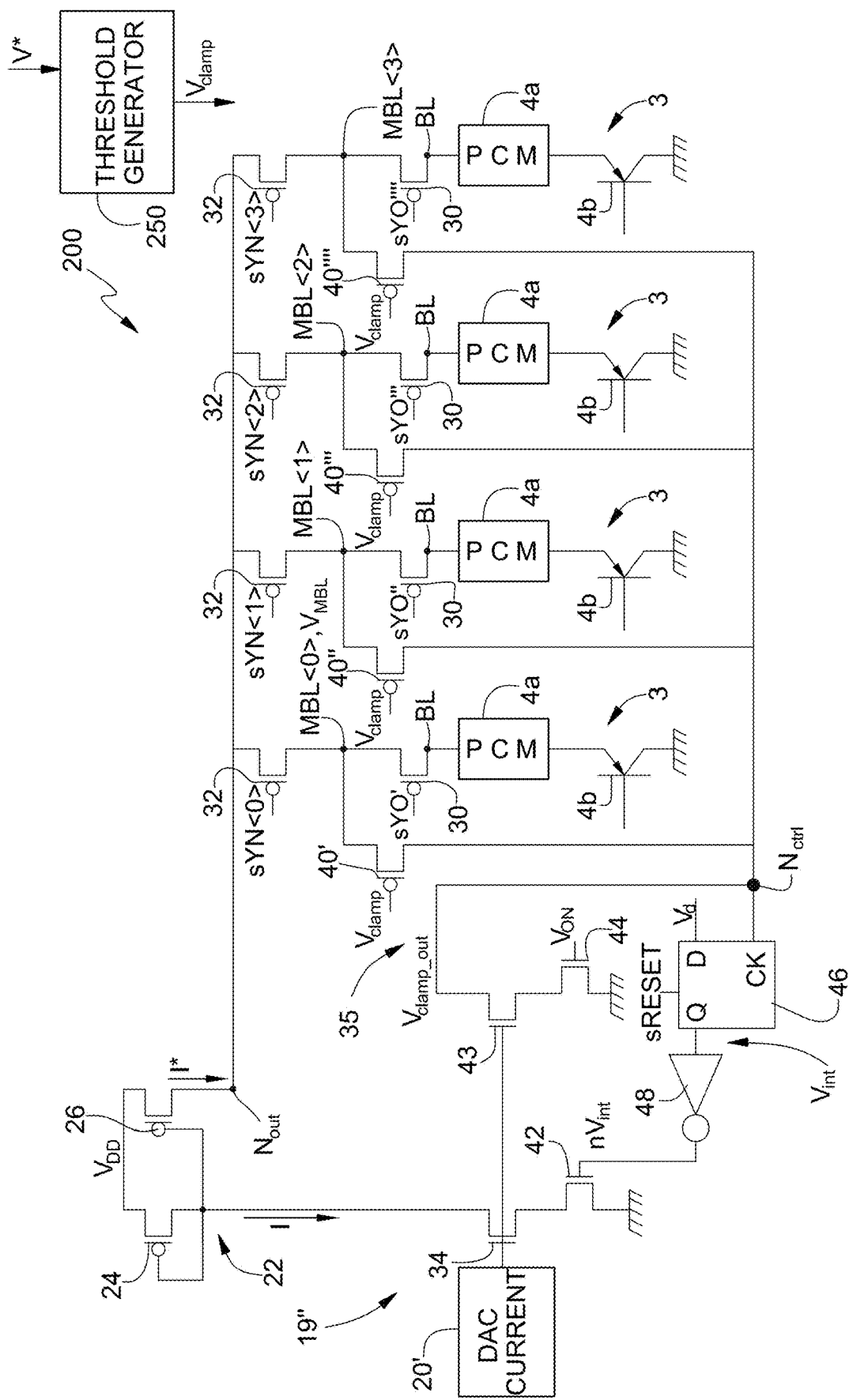

According to the embodiment shown in FIG. 5, the memory device 100 includes one program driver circuit 19' for each main bitline MBL. FIG. 6 shows a further embodiment, in which each program driver circuit (designated by 19") is coupled to more than one main bitline. This embodiment will be described with reference to the differences over the memory device 100 of FIG. 5, unless otherwise specified. Furthermore, elements already present in the memory device 100 will be designated by means of the same reference signs, unless otherwise specified.

In detail, in the memory device (designated by 200) of FIG. 6, each program driver circuit 19" (only one shown in FIG. 6) can be coupled to, as an example, four main bitlines, which are respectively designated by MBL<0>-MBL<3>; the corresponding four main selection transistors 32 are controlled by the main column-decoding signals sYN<0>-sYN<3>, which are generated by the control logic CL so that only one of them is set to '1', at a time, the others being set to '0'. In addition, for each of the main bitlines <1>-MBL<4>, only one of the corresponding k local bitlines BL is shown in FIG. 6; the local column-decoding signals controlling the corresponding four local selection transistors 30 are respectively designated by sYO', sYO", sYO''' and sYO''''.

In greater detail, the limiter circuit 35 comprises, for each main bitline, a corresponding limiting transistor; in FIG. 6, the four limiting transistors are respectively designated by 40', 40'', 40''' and 40''''. Each of the limiting transistors 40'-40'''' is a P-channel enhancement MOS transistor, which is equal to the output transistor 58.

Each of the limiting transistors 40'-40'''' has a source terminal, which is connected to the corresponding main bitline MBL<0>-MBL<3>, and a corresponding drain terminal, which is connected to the drain terminal of the first additional transistor 43, i.e., to the control node $N_{ctrl}$; the voltage on the control node $N_{ctrl}$ is still referred to as voltage $V_{clamp\_out}$. The gate terminals of the limiting transistors 40'-40'''' receive the voltage $V_{clamp}$ generated by the threshold generator (designated by 250), which is shared among the program driver circuits 19''.

As shown in FIG. 7, the threshold generator 250 is the same as the one shown in FIG. 5, but for the following differences.

In detail, the positive input terminal of the operational amplifier 54 is connected to the dummy main bitline MBL*. Therefore, the dummy main selection transistor 32* is outside the control loop which generates the voltage $V_{clamp}$. In addition, in this case the following equation applies:

$$V_{clamp}=V_{be}+R^*(I^{**})+V'-V_{th}$$

In practice, the sum of the voltage $V_{clamp}$ and the threshold voltage $V_{th}$ of the output transistor 58 simulates the greatest allowed voltage on the main bit line MBL coupled to the selected memory cell 3 in the absence of the open bit.

Basically, the memory device 200 functions in the same way as the memory device 100. In particular, as mentioned before, at any time, only one of the main selection transistors 32 coupled to the main bitlines MBL<0>-MBL<3> is on, i.e., only the main selection transistor 32 connected to the selected main bitline MBL is on. As an example, in the following it is assumed that the main bitline MBL<0> has been selected. Furthermore, in case an open bit occurs during the writing of one of the memory cells 3 connected to one of the k local bitlines BL which can be coupled to the main bitline MBL<0>, the voltage on the main bitline MBL<0> (designated by $V_{MBL}$ in FIG. 6) tends to rise; however, when the voltage on the main bitline MBL<0> overcomes the voltage $V_{clamp}+V_{th40'}$ (with $V_{th40'}$ which designates the threshold voltage of the limiting transistor 40'), the limiting transistor 40' turns on; the voltage $V_{clamp}+V_{th40'}$ is equal to the greatest voltage which should be present on the main bitline MBL<0> in the absence of the open bit. Consequently, the voltage $V_{clamp\_out}$ becomes equal to '1', thereby causing a switching of the logic value of the voltage $V_{int}$ on the output terminal Q of the flip-flop circuit 46, which becomes equal to '1'. Therefore, the preliminary programming current I and the programming current I* are turned off, in the same way as described with reference to the memory device 100.

Still with reference to the embodiment of FIGS. 6-7, the dummy main selection transistor 32* does not concur in determining the voltage $V_{clamp}$, therefore this latter better emulates the voltage which should be present on the selected main bitline MBL in the absence of the open bit.

Further embodiments are possible, as an example in which the mechanism of injection of the programming current I* in the output node $N_{out}$ is different from the one previously described.

Figure 8:
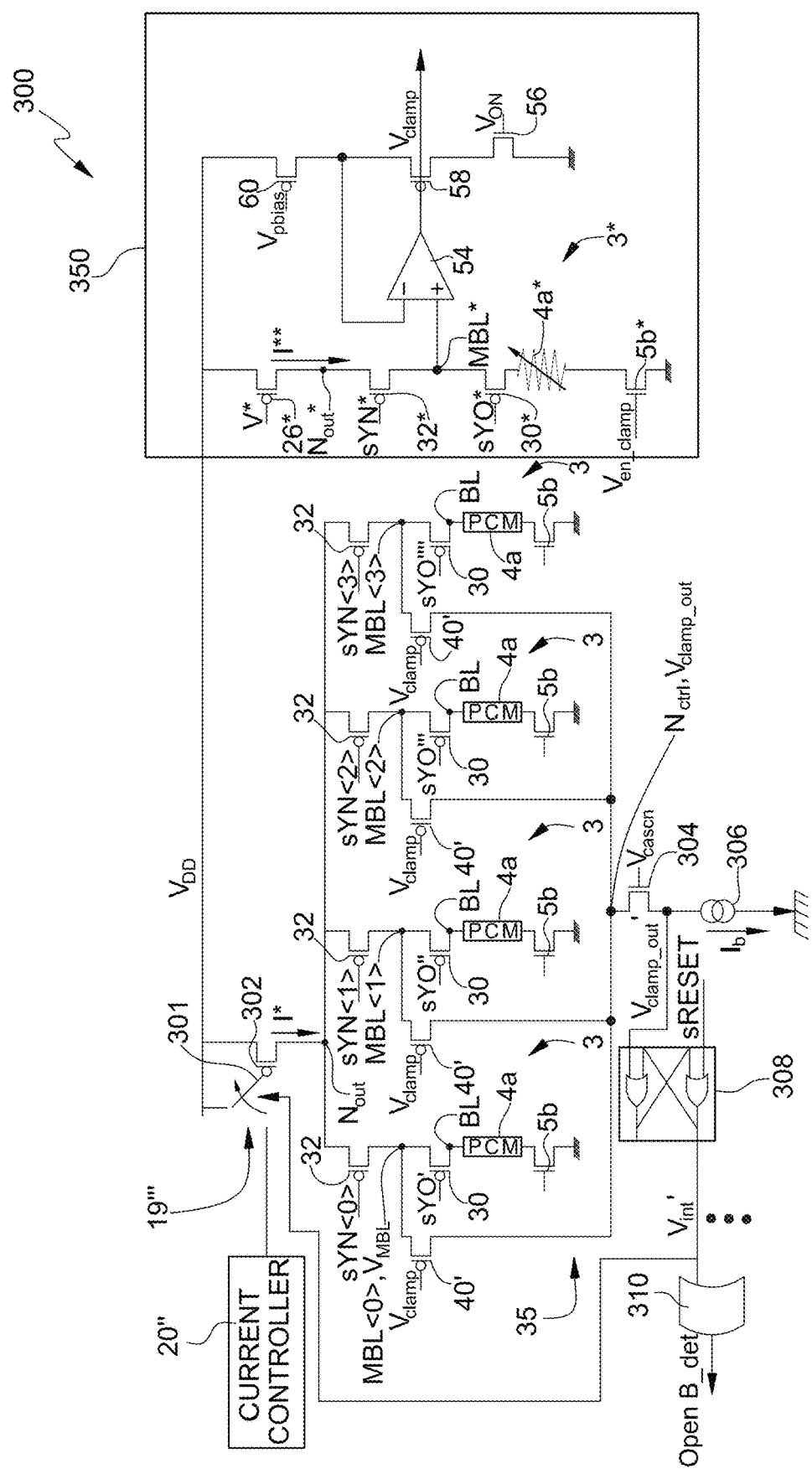

As an example, FIG. 8 shows an embodiment which is the same as the one of FIGS. 6-7, but for the following differences.

In detail, the selector element of each memory cell 3 is formed by a corresponding access transistor (here designated by 5b), which is a N-channel enhancement MOSFET transistor. Furthermore, the drain terminal of each access transistor 5b is connected to the corresponding storage element 4a, whereas the source terminal is connected to ground. In case of selection of the corresponding wordline WL, the gate terminal of any access transistor 5b is set to '1', in a per se known manner.

The memory device (here designated by 300) comprises a current controller 20'', which is shared among the program driver circuits (here designated by 19'''; only one shown in FIG. 8). Furthermore, each program driver circuit 19''' comprises a driving switch 301 and an injection transistor 302, which is a P-channel enhancement MOSFET transistor.

The source terminal of the injection transistor 302 is set at the supply voltage $V_{DD}$, whereas the drain terminal is connected to the output node $N_{out}$. The driving switch 301 is controlled by a voltage $V_{int}'$, so as to, alternatively, i) couple the gate terminal of the injection transistor 302 to the current controller 20'' (when $V_{int}'$ is equal to the logic value '0') or ii) set it to the supply voltage $V_{DD}$ (when $V_{int}'$ is equal to the logic value '1'). In particular, when the gate terminal of the injection transistor 302 is coupled to the current controller 20'', the injection transistor 302 injects the programming current I* in the output node $N_{out}$; on the contrary, when the gate terminal of the injection transistor 302 is set to the supply voltage $V_{DD}$, the injection transistor 302 is off.

In addition, the memory device 300 further comprises a cascode transistor 304, a current generator 306 and a latch circuit 308.

The cascode transistor 304 is a N-channel enhancement MOSFET transistor, whose drain terminal and source terminal are respectively connected to the control node $N_{ctrl}$, and to the current generator 306, this latter being also connected to ground and being configured to generate a bias current $I_b$.

A first input of the latch circuit 308 is connected to the source terminal of the cascode transistor 304, whereas the second input terminal of the latch circuit 308 receives the signal sRESET.

In use, the cascode transistor 304 is kept on by the control logic CL, by setting its gate terminal at a voltage $V_{casn}$, as an example equal to 1.5V. Furthermore, a voltage $V_{clamp\_out}'$ is present on the first input of the latch circuit 308, which has the same logic value of the voltage $V_{clamp\_out}$ on the control node $N_{ctrl}$. In particular, if the voltage $V_{clamp\_out}$ is respectively equal (as an example) to 0V or 4.5V, the voltage $V_{clamp\_out}'$ is respectively equal to 0V or 1V, due to the presence of the cascode transistor 304.

The latch circuit 308 generates on its output the above-mentioned voltage $V_{int}'$, as a function of the voltage $V_{clamp\_out}'$, and thus as a function of the voltage $V_{clamp\_out}$, so—that the voltage $V_{int}'$ has the same logic value as the voltage $V_{clamp\_out}'$.

The threshold generator circuit (here designated by 350) is the same as the one of FIG. 7, but for the following differences.

The gate terminal of the dummy mirror transistor 26* is set at the voltage V*, so that the dummy current I** is equal to the maximum current which, during any writing operation (i.e., either of the set or reset type), flows in the memory cell 3 to be written.

The voltage $V_{pbias}$ is such that the bias transistor 60 is on, and the current which flows through the bias transistor 60 is equal to, as an example, half the current which flows in the current generator 306.

In addition, in the place of the dummy bipolar transistor 4b*, a dummy MOSFET transistor 5b* is present, which is equal to the access transistors 5b. The gate terminal of the dummy MOSFET transistor 5b* is set by the control logic CL at a voltage $V_{en\_clamp}$, which is the same as the voltage present on the wordlines WL when selected, so as to keep the dummy MOSFET transistor 5b* on.

The functioning of the memory device 300 is the same as the one of the memory device 200.

In detail, by considering that the voltage drop on the dummy MOSFET transistor 5b* is negligible, the following equation applies:

$$V_{clamp} = R^*(I^{**}) + V' - V_{th}$$

In use, after a reset of the latch circuit 308 through the signal sRESET, the voltage $V_{int}'$ is equal to the logic value '0', so as to force the driving switch 301 to connect the gate terminal of the injection transistor 302 to the current controller 20'', so as to generate the programming current I*.

Assuming as an example that the main bitline MBL<0> has been selected and assuming that an open bit occurs during the writing of one of the memory cells 3 connected to one of the k local bitlines BL which can be coupled to the main bitline MBL<0>, the voltage on the main bitline MBL<0> tends to rise; however, when the voltage on the main bitline MBL<0> (designated by $V_{MBL}$ in FIG. 8) overcomes the voltage $V_{clamp} + V_{th40'}$ (with $V_{th40'}$ which designates the threshold voltage of the limiting transistor 40'), the limiting transistor 40' turns on. Consequently, the voltages $V_{clamp\_out}$, $V_{clamp\_out}'$ and $V_{int}'$ become equal to '1'; therefore the voltage $V_{int}'$ forces the driving switch 301 to disconnect the gate terminal of the injection transistor 302 from the current controller 20'', and to set it to the supply voltage $V_{DD}$. In such a way, the injection transistor 302 turns off, and the programming current I* is turned off, thereby protecting the memory device 300. From another point of view, the voltage $V_{clamp\_out}'$ results from the comparison between the current flowing through the current generator 306 and the current flowing through the limiting transistor 40' and the cascode transistor 304, this latter being substantially equal to the current flowing through the output transistor 58 and being thus set by the voltage $V_{pbias}$, so that the ratio between the currents flowing through the current generator 306 and the limiting transistor 40' falls within a predetermined range (e.g., between 0.1 and 10). This having been said, if the current flowing through the current generator 306 is respectively greater than, or lower than, the current flowing through the limiting transistor 40', the voltage $V_{clamp\_out}'$ is respectively equal to the logic value '0' or to the logic value '1'.

The memory device 300 further comprises a logic gate 310 of the 'OR' type. In particular, in order to detect the occurrence of an open bit in the memory array 2, the voltages $V_{int}'$ (only one shown in FIG. 8) of all the program driver circuits 19''' are used as inputs of the logic gate 310, so that the output of the logic gate 310 goes to '1' as soon as one of the voltages $V_{int}'$ goes to '1'. Such a circuit scheme may be implemented also in the embodiment shown in FIGS. 6-7. However, by referring to the output voltage of the abovementioned logic gate 310 as the signal OpenB_det, such a signal OpenB_det allows detecting the occurrence of an open bit, but it does not allow identifying the group of main bitlines MBL connected to the memory cell 3 in which the open bit has occurred during the writing. In order to provide also this functionality, it is possible to implement the embodiment shown in FIG. 9, in which the memory device is designated by 400.

Figure 9:
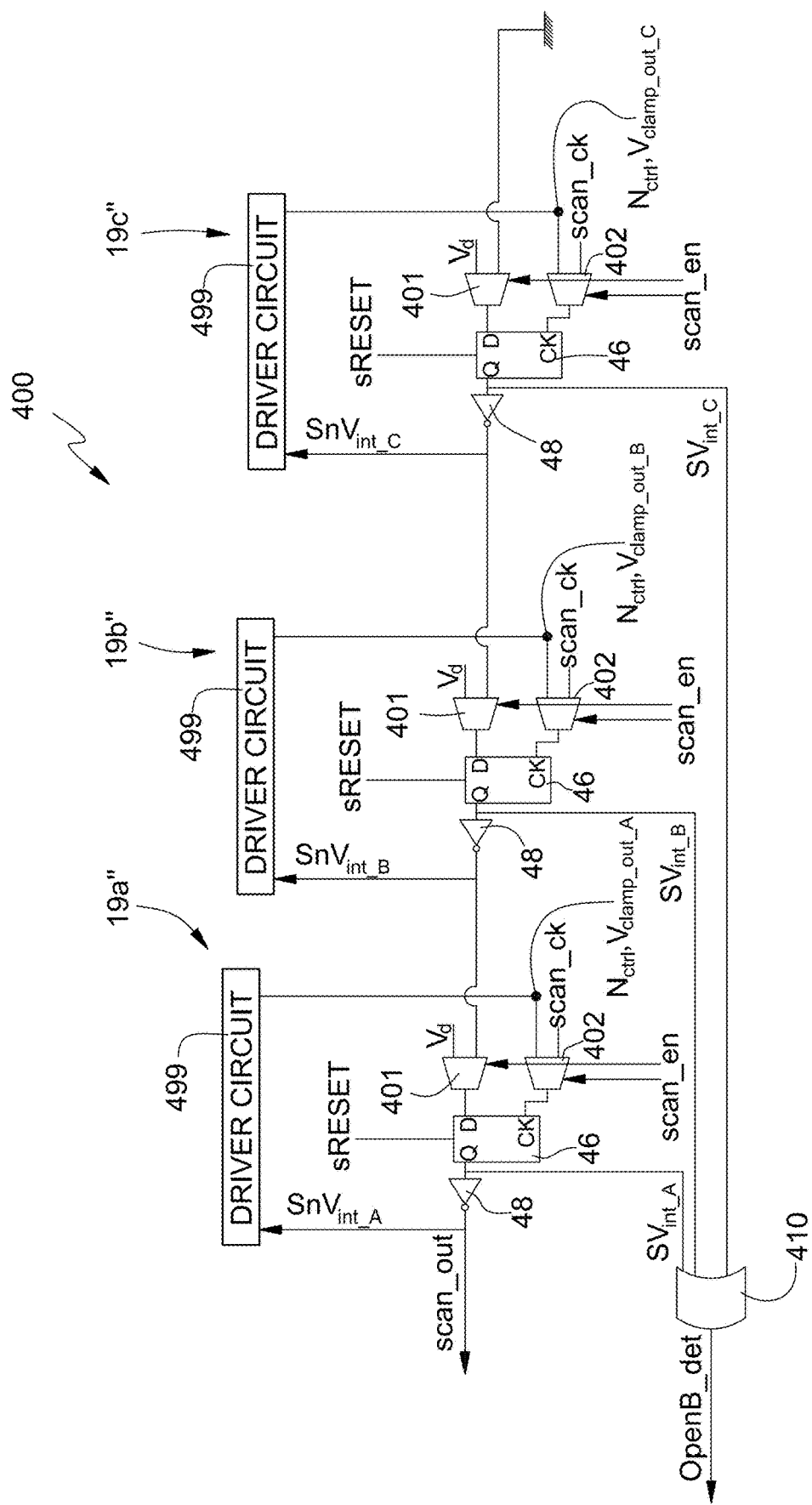

Without any loss of generality, the embodiment of FIG. 9 makes reference to the embodiment of FIGS. 6-7, under the assumption that the memory device 400 includes a first, a second and a third program driver circuits 19a''', 19b''', 19c''' arranged in sequence, each of which is associated to a corresponding group of four main bitlines MBL (not shown), as well as to a corresponding control node $N_{ctrl}$. In other words, although not shown, each of the first, second and third program driver circuits 19a''', 19b''', 19c''' is coupled to a corresponding portion of the memory array 2 (not shown in FIG. 9) in the same way as shown in FIG. 6. To this regard, in FIG. 9, for each of the first, second and third program driver circuits 19a''', 19b''', 19c''', the corresponding part other than the corresponding inverter circuit 48 and the corresponding flip-flop circuit 46 is schematically shown as a box, designated by 499.

The voltages on the control nodes $N_{ctrl}$ of the first, second and third program driver circuits 19a''', 19b''', 19c''' are respectively designated by $V_{clamp\_out\_A}$, $V_{clamp\_out\_B}$ and $V_{clamp\_out\_C}$. The voltages on the outputs of the inverter circuits 48 of the first, second and third program driver circuits 19a''', 19b''', 19c''' are respectively designated by $SnV_{int\_A}$, $SnV_{int\_B}$ and $SnV_{int\_C}$; the voltages on the outputs of the flip-flop circuits 46 of the first, second and third program driver circuits 19a''', 19b''', 19c''' are respectively designated by $SV_{int\_A}$, $SV_{int\_B}$ and $SV_{int\_C}$.

In addition, the memory device 400 includes, for each of the first, second and third program driver circuits 19a''', 19b''', 19c''', a corresponding first multiplexer 401 and a corresponding second multiplexer 402.

In detail, the first and second input terminals of the first multiplexer 401 of the first program driver circuit 19a''' are respectively connected to the secondary supply voltage $V_d$ and to the output of the inverter circuit 48 of the second program driver circuit 19b''', to receive the voltage $SnV_{int\_B}$. The first input terminal of the second multiplexer 402 of the first program driver circuit 19a''' is connected to the corresponding control node $N_{ctrl}$, to receive the voltage $V_{clamp\_out\_A}$. The second input terminal of the second multiplexer 402 of the first program driver circuit 19a''' receives a clock signal scan_ck, which may be generated by the control logic CL.

The outputs of the first and second multiplexers 401, 402 of the first program driver circuit 19a''' are connected, respectively, to the data input terminal and to the clock input terminal of the corresponding flip-flop circuit 46.

The first and second input terminals of the first multiplexer 401 of the second program driver circuit 19b''' are respectively connected to the secondary supply voltage $V_d$ and to the output of the inverter circuit 48 of the third program driver circuit 19b''', to receive the voltage $SnV_{int\_C}$. The first input terminal of the second multiplexer 402 of the second program driver circuit 19b''' is connected to the corresponding control node $N_{ctrl}$, to receive the voltage $V_{clamp\_out\_B}$. The second input terminal of the second multiplexer 402 of the second program driver circuit 19b''' receives the clock signal scan_ck.

The outputs of the first and second multiplexers 401, 402 of the second program driver circuit 19b''' are connected, respectively, to the data input terminal and to the clock input terminal of the corresponding flip-flop circuit 46.

The first and second input terminals of the first multiplexer 401 of the third program driver circuit 19c''' are respectively connected to the secondary supply voltage $V_d$ and to ground. The first input terminal of the second multiplexer 402 of the third program driver circuit 19c''' is connected to the corresponding control node $N_{ctrl}$, to receive the voltage $V_{clamp\_out\_C}$. The second input terminal of the second multiplexer 402 of the third program driver circuit 19c''' receives the clock signal scan_ck.

The outputs of the first and second multiplexers 401, 402 of the third program driver circuit 19c''' are connected, respectively, to the data input terminal and to the clock input terminal of the corresponding flip-flop circuit 46.

All the first and second multiplexers 401, 402 are controlled by means of a signal scan_en generated by the control logic CL, so that, when the signal scan_en is equal to the logic value '0', each of the first and second multiplexers 401, 402 connects its output terminal to its first input terminal, and when the signal scan_en is equal to the logic value '1', each of the first and second multiplexers 401, 402 connects its output terminal to its second input terminal. To this regard, the control logic CL may be controlled (i.e., programmed), in a per se known manner, so as to set the signal scan_en equal to '0' (e.g., in normal use) or to '1' (e.g., during a failure analysis).

In addition, the memory device 400 includes a logic gate 410 of the 'OR' type, which receives at input the voltages $SV_{int\_A}$, $SV_{int\_B}$ and $SV_{int\_C}$ and generates the signal OpenB_det.

Basically, when the control logic CL sets the signal scan_en equal to the logic value '0', the memory device 400 functions as the memory device 200. In this case, the voltages $SnV_{int\_A}$, $SnV_{int\_B}$ and $SnV_{int\_C}$ are equal to voltages $nV_{int}$ which are generated, respectively, by the inverter circuits 48 of the first, second and third program driver circuits 19a''', 19b''', 19c'''; similarly, the voltages $SV_{int\_A}$, $SV_{int\_B}$ and $SV_{int\_C}$ are equal to voltages $V_{int}$ which are generated, respectively, by the flip-flop circuits 46 of the first, second and third program driver circuits 19a''', 19b''', 19c'''. Therefore, the signal OpenBit_det is equal to '0' in the absence of open bit and is equal to '1' when an open bit occurs, irrespective of the position of the open bit.

In practice, in normal use the signal scan_en is equal to '0', and the control logic CL can detect, based on the signal OpenBit_det, the occurrence of an open bit during a writing step. To this regard, in a per se known manner, during the writing the first, second and third program driver circuits 19a''', 19b''', 19c''' share the same address, i.e., they select and write at the same time respective selected memory cells 3 which have the same relative position, i.e., are addressed by means of the same pair of local and main column-decoding signals. As an example, by assuming that the shared address corresponds to the U-th main bitline MBL and to the L-th local bitline BL, each of the first, second and third program driver circuits 19a", 19b", 19c" selects the respective main bitline MBL<U> and the respective local bitlines BL<L>, only the local bitline BL<L> which is coupled to the main bitline MBL<U> being traversed by the programming current I*.

In addition, as explained before, the control logic CL can be controlled so as to set the signal scan_en equal to '1', as an example after the detection of the occurrence of an open bit during a writing step involving a selected local bitline BL, a selected main bitline MBL and a selected wordline WL. When the control logic CL sets the signal scan_en equal to the logic value '1', the memory device 400 implements a scan chain, as described here below.

In detail, the switching of the signal scan_en to '1' implies that the voltages (in particular, the corresponding logic values) on the output terminals Q of the flip-flops 46, and thus also on the output terminals of the inverter circuits 48, "freeze", i.e. they do not change, until the control logic CL generates a pulse of the clock signal scan_ck, as described here below. Therefore, also the logic values of the voltages $SnV_{int\_A}$, $SnV_{int\_B}$ and $SnV_{int\_C}$ remain stuck to the corresponding logic values which were generated during the abovementioned writing step (i.e., during the last writing step with the signal scan_en equal to '0'), until the control logic CL generates a pulse of the clock signal scan_ck.

In addition, the logic values on the data inputs of the flip-flop circuits 46 of the first and second program driver circuits 19a", 19b" are respectively equal to the logic values of the voltages $SnV_{int\_B}$ and $SnV_{int\_C}$, which, as said before, are respectively equal to the voltages $nV_{int}$ which were generated by the inverter circuits 48 of the second and third program driver circuits 19b", 19c" during the abovementioned writing step (i.e., when the signal scan_en was equal to '0'); similarly, as said before, the logic value of the voltage $SnV_{int\_A}$ is equal to the logic value of the voltage $nV_{int}$ which was generated by the inverter circuit 48 of the first program driver circuit 19a" during the abovementioned writing step. Therefore, the logic values of the voltages $SnV_{int\_A}$, $SnV_{int\_B}$ and $SnV_{int\_Cv}$ depend on whether the open bit occurred in a memory cell 3 coupled to the corresponding program driver circuit, or not.

This having been said, by referring to the signal scan_out to designate the signal present on the output terminal of the inverter circuit 48 of the first program driver circuit 19a" when the signal scan_en is equal to '1', it happens as follows.

Each group formed by the flip-flop circuit 46, the inverter circuit 48 and the first and second multiplexers 401, 402 of any of the first, second and third program driver circuits 19a", 19b", 19c" acts as a reconfigurable circuit, which operates in a different mode, based on the logic value of the signal scan_en. Furthermore, when the signal scan_en is equal to '1', the input of each reconfigurable circuit is coupled to the output of the following reconfigurable circuit, so as to receive the logic value present on this latter and transfer this logic value onto its own output, when a pulse of the clock signal scan_ck occurs.

In view of the above, after the switching to '1' of the signal scan_en, the signal scan_out has a first logic value, which is equal to the logic value of the voltage $SnV_{int\_A}$, which is equal to '1' if the open bit occurred in a memory cell 3 connected to the first program driver circuit 19a", otherwise it is equal to '0'.

After a first pulse of the clock signal scan_ck, the signal scan_out has a second logic value, which is the same as the logic value of the voltage $SnV_{int\_B}$, which is equal to '1' if the open bit occurred in a memory cell 3 connected to the second program driver circuit 19b", otherwise it is equal to '0'.

After a second pulse of the clock signal scan_ck, the signal scan_out has a third logic value, which is the same as the logic value of the voltage $SnV_{int\_C}$, whose logic value is equal to '1' if the open bit occurred in a memory cell 3 connected to the third program driver circuit 19c", otherwise it is equal to '0'.

Therefore, based on the abovementioned first, second and third logic values assumed by the signal scan_out, the control logic CL can determine whether the open bit occurred in a memory cell 3 written either by the first or the second or the third program driver circuits 19a", 19b", 19c"; furthermore, by referring to the abovementioned selected main bitline MBL, selected bitline BL (in particular, to the corresponding main column-decoding signal and corresponding local column-decoding signal) and selected wordline WL, the control logic CL can determine the memory cell 3 in which the open bit occurred.

Although not shown, embodiments are possible, which are the same as the one shown in FIG. 9, but in which the program driver circuits are of the types shown in FIG. 5 or 8; the threshold generator circuit may vary accordingly.

Figure 10:
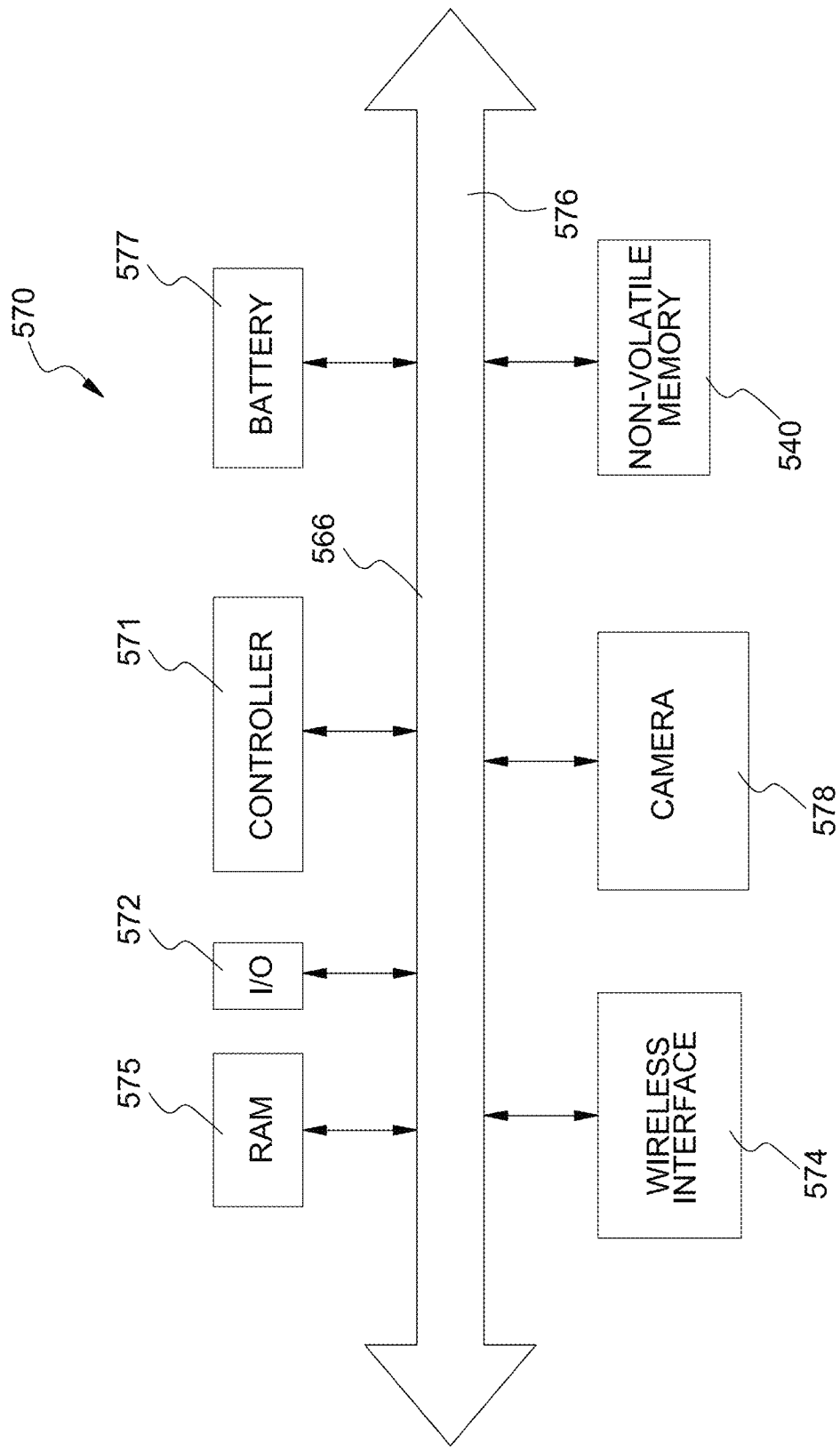
FIG. 10 shows a block diagram of an electronic apparatus that incorporates the present memory device.

FIG. 10 shows an example of application of a memory device (designated by 500) according to any of the preceding. In particular, FIG. 10 illustrates a portion of an electronic apparatus 570, which may, for example, be: a PDA (personal digital assistant); a portable or fixed computer, possibly with wireless data-transfer capacity; a mobile phone; a digital audio player; a photographic camera or a camcorder; or further devices that are able to process, store, transmit, and receiving information.

In detail, the electronic apparatus 570 comprises: a controller 571 (for example, provided with a microprocessor, a DSP, or a microcontroller); an input/output device 572 (for example, provided with a keypad and a display), for input and display of the data; the memory device 500; a wireless interface 574, for example an antenna, for transmitting and receiving data through a radiofrequency wireless communication network; and a RAM 575. All the components of the electronic apparatus 570 are coupled through a bus 576. It is possible to use a battery 577 as electrical supply source in the electronic apparatus 570, which may moreover be provided with a photographic or video camera 578. In addition, the controller 571 can control the memory device 500, for example by co-operating with the control logic CL.

The advantages provided by the present memory device are made clear by the above description.

In particular, the present solution allows avoiding the occurrence of overvoltage stresses on the transistors of the column decoder, in case an open bit occurs during a writing step, so as to protect the transistors. Furthermore, the implementation of the threshold generator circuit, which includes a dummy circuit, allows precisely generating a reference voltage which simulates the voltage which occurs in the column decoder, in the absence of open bits.

Basically, the protection is obtained, in each program driver circuit, by sensing, for each main bitline coupleable of the program driver circuit, a corresponding sense node, which, in case of a single main bitline coupleable to the program driver circuit, coincides with the output node $N_{out}$ of the program driver, and, in case of more than one main bitlines coupleable to the program driver circuit, coincides with the main bitline. In both cases, the voltage on the sense node at least depends on (or may even coincide with) the voltage on the corresponding main bitline, when the selected memory cell coupled to the output node N$_{out}$ of the program driver circuit (i.e., the cell written by the considered program driver circuit) is coupled to the corresponding main bitline (i.e., and not to the other, if any, main bitlines coupleable to the considered program driver circuit).

In addition, the control logic CL may optimize the writing strategies, based on the detection of possible open bits. As an example, in case of a writing operation of the set type (i.e., to write the logic value '1' in a memory cell storing the logic value '0') with an open bit, the memory cell is always read as zero; therefore, the control logic CL verifies the state and tries to provide more pulses to set the logic value '1'. However, the limiter circuit 35 may turn off the programming current I* during the first pulse and prevent the generation of further pulses of the programming current I*.

Some embodiments also allow not only to protect the memory device, but also to identify the damaged memory cells.

Finally, it is clear that modifications and variations may be made to what has been described and illustrated herein, without thereby departing from the scope of the present invention, as defined in the annexed claims.

As an example, the limiter circuit may be different from the embodiments described above. As an example, embodiments (not shown) are possible, which are respectively the same as corresponding ones described before, but in which an additional transistor is present. This additional transistor may be a N-MOS enhancement transistor, whose drain and source terminals are respectively connected the control node N$_{ctrl}$, and to ground; furthermore, the gate terminal of this additional transistor is controlled by means of a voltage which is generated by the control logic CL so as to be equal to the logic negation of the voltage V$_{ON}$, so as to force to ground the voltage V$_{clamp\_out}$, in case of a writing operation in which the limiter circuit is not intended to be used (i.e., when the voltage V$_{ON}$ is equal to '0'), without affecting the functioning of the limiter circuit when the voltage VON is equal to '1'.

In a per known manner, the control logic CL may implement different writing strategies. As an example, the control logic CL may set to '1' the signal sRESET after each writing operation; in this way, the limiter circuit is ready for the following writing operation, as an example on a following address.

Finally, as said before, the memory cells may be of a type different from what has been described.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A non-volatile memory device comprising:
    an array of memory cells arranged in rows and columns, each memory cell including a respective storage element and a respective access element;
    a plurality of wordlines, the memory cells of each row being coupled to a corresponding wordline of the plurality of wordlines;
    a plurality of local bitlines, the memory cells of each column being coupled to a corresponding local bitline of the plurality of local bitlines;
    a plurality of main bitlines, each main bitline being coupleable to a corresponding subset of local bitlines of the plurality of local bitlines;
    a plurality of program driver circuits, each of which has a corresponding output node and is configured to inject a programming current in the corresponding output node, each output node being coupleable to a corresponding subset of main bitlines of the plurality of main bitlines;
    a column decoder including, for each program driver circuit:
        for each of the main bitlines of the corresponding subset of main bitlines, a corresponding main selection circuit, which is electronically controllable so as to selectively couple the main bitline to the output node of the program driver circuit; and
        for each of the local bitlines of the corresponding subset of local bitlines coupleable to a corresponding main bitline of the corresponding subset of main bitlines, a local selection circuit, which is electronically controllable so as to selectively couple the local bitline to the corresponding main bitline; and
    a control unit which is configured to control the local selection circuits and the main selection circuits so that, during a step of writing at least one selected memory cell, each of the at least one selected memory cell is coupled to the output node of a corresponding program driver circuit of the plurality of program driver circuits through the corresponding local bit line and the corresponding main bit line, so as to be traversed by the corresponding programming current,
    wherein each corresponding program driver circuit further includes a corresponding limiter circuit which is electrically coupled, for each main bitline of the corresponding subset, to a corresponding sense node whose voltage depends, when the at least one selected memory cell coupled to the output node of the corresponding program driver circuit is coupled to the corresponding main bitline, on the voltage on the corresponding main bitline; and wherein each limiter circuit is configured to turn off the corresponding programming current, in response to the voltage on any of the corresponding sense nodes overcoming a reference voltage.

2. The memory device according to claim 1, wherein each limiter circuit comprises, for each main bitline of the corresponding subset of main bitlines, a corresponding switching element, which is coupled to the corresponding main bitline and to a control node of the limiter circuit, the switching element being configured to couple the corresponding main bitline to the control node, in response to the voltage on the corresponding main bitline overcoming the reference voltage, so as to cause a switching of a logic value of a control voltage on the control node; and wherein each limiter circuit is configured so that the control voltage on the corresponding control node controls the turning off of the corresponding programming current.

3. The memory device according to claim 2, wherein, during the step of writing, the control unit controls the local selection circuits and the main selection circuits coupled to the selected memory cells through, respectively, a same local column-decoding signal and a same main column-decoding signal; and wherein each limiter circuit further comprises a reconfigurable flip-flop circuit coupled to the corresponding control node, the control unit being controllable so as to cause the reconfigurable flip-flop circuits to operate, during the writing step, in a first mode; and wherein, when operating in the first mode, each reconfigurable flip-flop circuit is configured to:

generate, on a respective output, a respective interruption signal, whose logic value depends on the control voltage on the corresponding control node, the logic value on the respective output being indicative of whether, during the writing step, an open bit occurred in the selected memory cell coupled to the corresponding program driver circuit, the corresponding limiter circuit being further configured to turn off the corresponding programming current based on the respective interruption signal;

wherein, when the control unit is configured to cause the reconfigurable flip-flop circuits to operate in the first mode, the control unit is further configured to:

detect the occurrence, during the writing step, of an open bit in any of the selected memory cells, based on the generated interruption signals;

wherein the control unit is further controllable so as to cause the reconfigurable flip-flop circuits to operate, after the writing step, in a second mode; and wherein, when the control unit is configured to cause the reconfigurable flip-flop circuits to operate in the second mode, the control unit is further configured to generate a pulsed clock signal; and wherein, when operating in the second mode, the reconfigurable flip-flop circuits are coupled in cascade, and each reconfigurable flip-flop circuit is configured to:

couple a respective input to the output of the following reconfigurable flip-flop circuit, so as to receive the logic value on the output of the following reconfigurable flip-flop circuit, the logic value on the output of the following reconfigurable flip-flop circuit being indicative of whether, during the writing step, an open bit occurred in the selected memory cell coupled to the program driver circuit which corresponds to the following reconfigurable flip-flop circuit;

receive the clock signal; and transfer the logic value on the respective input onto the respective output, with a timing which depends on pulses of the clock signal; and wherein the control unit is further configured to determine the program driver circuit coupled, during the writing step, to the selected memory cell in which an open bit occurred, based on the logic values on the output of the first reconfigurable flip-flop circuit of the cascade, during at least one of the pulses of the clock signal.

4. The memory device according to claim 1, wherein, for each program driver circuit, the corresponding subset of main bitlines includes a single corresponding main bitline; and wherein each limiter circuit comprises a corresponding switching element, which is coupled to the corresponding output node and to a corresponding control node, the switching element being configured to couple the corresponding output node to the corresponding control node, in response to the voltage on the corresponding output node overcoming the reference voltage, so as to cause a switching of a logic value of a control voltage on the corresponding control node; and wherein each limiter circuit is configured so that the control voltage on the corresponding control node controls the turning off of the corresponding programming current.

5. The memory device according to claim 4, wherein, during the step of writing, the control unit controls the local selection circuits and the main selection circuits coupled to the selected memory cells through, respectively, a same local column-decoding signal and a same main column-decoding signal; and wherein each limiter circuit further comprises a reconfigurable flip-flop circuit coupled to the corresponding control node, the control unit being controllable so as to cause the reconfigurable flip-flop circuits to operate, during the writing step, in a first mode; and wherein, when operating in the first mode, each reconfigurable flip-flop circuit is configured to:

generate, on a respective output, a respective interruption signal, whose logic value depends on the control voltage on the corresponding control node, the logic value on the respective output being indicative of whether, during the writing step, an open bit occurred in the selected memory cell coupled to the corresponding program driver circuit, the corresponding limiter circuit being further configured to turn off the corresponding programming current based on the respective interruption signal;

wherein, when the control unit is configured to cause the reconfigurable flip-flop circuits to operate in the first mode, the control unit is further configured to:

detect the occurrence, during the writing step, of an open bit in any of the selected memory cells, based on the generated interruption signals;

wherein the control unit is further controllable so as to cause the reconfigurable flip-flop circuits to operate, after the writing step, in a second mode; and wherein, when the control unit is configured to cause the reconfigurable flip-flop circuits to operate in the second mode, the control unit is further configured to generate a pulsed clock signal; and wherein, when operating in the second mode, the reconfigurable flip-flop circuits are coupled in cascade, and each reconfigurable flip-flop circuit is configured to:

couple a respective input to the output of the following reconfigurable flip-flop circuit, so as to receive the logic value on the output of the following reconfigurable flip-flop circuit, the logic value on the output of the following reconfigurable flip-flop circuit being indicative of whether, during the writing step, an open bit occurred in the selected memory cell coupled to the program driver circuit which corresponds to the following reconfigurable flip-flop circuit;

receive the clock signal; and transfer the logic value on the respective input onto the respective output, with a timing which depends on pulses of the clock signal; and wherein the control unit is further configured to determine the program driver circuit coupled, during the writing step, to the selected memory cell in which an open bit occurred, based on the logic values on the output of the first reconfigurable flip-flop circuit of the cascade, during at least one of the pulses of the clock signal.

6. The memory device according to claim 1, further comprising a threshold generator circuit, which includes:

a dummy current generator configured to inject a dummy current in a dummy node;

a dummy main bitline and a dummy local bitline;

a dummy memory cell including a resistor and coupled to the dummy local bitline;

a dummy main selection circuit equal to the main selection circuits and electronically controllable so as to couple the dummy main bitline to the dummy node; and a dummy local selection circuit equal to the local selection circuits and electronically controllable so as to couple the dummy bitline to the dummy main bitline;

wherein the threshold generator circuit is configured so that, during the writing step, the dummy memory cell is coupled to the dummy node through the dummy local selection circuit and the dummy main selection circuit, so as to be traversed by the dummy current; and wherein the threshold generator circuit is configured to generate a clamp voltage as a function of the voltage on a dummy sense node, the voltage on the dummy sense node depending on the voltage on the dummy main bitline; and wherein the reference voltage depends on the clamp voltage.

7. The memory device according to claim 6, wherein each limiter circuit comprises, for each main bitline of the corresponding subset of main bitlines, a corresponding switching element, which is coupled to the corresponding main bitline and to a control node of the limiter circuit, the switching element being configured to couple the corresponding main bitline to the control node, in response to the voltage on the corresponding main bitline overcoming the reference voltage, so as to cause a switching of a logic value of a control voltage on the control node; and wherein each limiter circuit is configured so that the control voltage on the corresponding control node controls the turning off of the corresponding programming current, and wherein the threshold generator circuit includes a voltage follower circuit which is configured to generate the clamp voltage based on the voltage on the dummy main bitline.

8. The memory device according to claim 6, wherein, for each program driver circuit, the corresponding subset of main bitlines includes a single corresponding main bitline; and wherein each limiter circuit comprises a corresponding switching element, which is coupled to the corresponding output node and to a corresponding control node, the switching element being configured to couple the corresponding output node to the corresponding control node, in response to the voltage on the corresponding output node overcoming the reference voltage, so as to cause a switching of a logic value of a control voltage on the corresponding control node; and wherein each limiter circuit is configured so that the control voltage on the corresponding control node controls the turning off of the corresponding programming current, and wherein the threshold generator circuit includes a voltage follower circuit which is configured to generate the clamp voltage based on the voltage on the dummy node.

9. The memory device according to claim 7, wherein the voltage follower circuit comprises:
an amplifier, which is coupled to the dummy sense node; and
an output element which is equal to the switching elements of the program driver circuits and forms a closed loop with the amplifier;
wherein the clamp voltage is a function of an output voltage generated by the amplifier.

10. The memory device according to claim 6, wherein each storage element has a value of resistance which varies when the corresponding memory cell is written; and wherein a resistance of the resistor is a function of a greatest value of resistance which is assumed by the storage elements during writing.

11. The memory device according to claim 6, wherein the step of writing is alternatively of a set or reset type; and wherein the dummy current is equal to a maximum value assumed, in case of writing of either the set and reset type, by the programming currents during the step of writing, in case of absence of open bits in the corresponding selected memory cells.

12. The memory device according to claim 6, wherein the control unit is configured to control the local selection circuits and the main selection circuits through corresponding local column-decoding signals and corresponding main column-decoding signals; and wherein, during the writing step, the dummy local selection circuit and the dummy main selection circuit are respectively controlled by a dummy local column-decoding signal and a dummy main column-decoding signal, which are respectively equal to the local column-decoding signal and the main column-decoding signals which control the local selection circuit and the main selection circuit which are coupled to the selected memory cell.

13. The memory device according to claim 6, wherein the dummy memory cell further comprises a dummy access element, which is equal to the access elements of the memory cells; and wherein the control unit is configured to control, during the writing step, the dummy access element through a corresponding signal which is equal to a voltage present on the wordline coupled to the selected memory cell.

14. An electronic apparatus comprising:
a bus;
a controller coupled to the bus; and
a memory device coupled to the bus, the memory device comprising:
an array of memory cells arranged in rows and columns, each memory cell including a respective storage element and a respective access element;
a plurality of wordlines, the memory cells of each row being coupled to a corresponding wordline of the plurality of wordlines;
a plurality of local bitlines, the memory cells of each column being coupled to a corresponding local bitline of the plurality of local bitlines;
a plurality of main bitlines, each main bitline being coupleable to a corresponding subset of local bitlines of the plurality of local bitlines;
a plurality of program driver circuits, each of which has a corresponding output node and is configured to inject a programming current in the corresponding output node, each output node being coupleable to a corresponding subset of main bitlines of the plurality of main bitlines;
a column decoder including, for each program driver circuit:
for each of the main bitlines of the corresponding subset of the main bitlines, a corresponding main selection circuit, which is electronically controllable so as to selectively couple the main bitline to the output node of the program driver circuit; and
for each of the local bitlines of the subset of local bitlines coupleable to a corresponding main bitline of the corresponding subset of main bitlines, a local selection circuit, which is electronically controllable so as to selectively couple the local bitline to the corresponding main bitline; and
a control unit which is configured to control the local selection circuits and the main selection circuits so that, during a step of writing at least one selected memory cell, each of the at least one selected memory cell is coupled to the output node of a corresponding program driver circuit of the plurality of program driver circuits through the corresponding local bitline and the corresponding main bitline, so as to be traversed by the corresponding programming current, wherein each program driver circuit further includes a corresponding limiter circuit which is electrically coupled, for each main bitline of the corresponding subset of main bitlines, to a corresponding sense node whose voltage depends, when the selected memory cell coupled to the output node of the corresponding program driver circuit is coupled to the corresponding main bitline, on the voltage on the corresponding main bitline; and wherein each limiter circuit is configured to turn off the corresponding programming current, in response to the voltage on any of the corresponding sense nodes overcoming a reference voltage.

15. The electronic apparatus according to claim 14, wherein each limiter circuit comprises, for each main bitline of the corresponding subset of main bitlines, a corresponding switching element, which is coupled to the corresponding main bitline and to a control node of the limiter circuit, the switching element being configured to couple the corresponding main bitline to the control node, in response to the voltage on the corresponding main bitline overcoming the reference voltage, so as to cause a switching of a logic value of a control voltage on the control node; and wherein each limiter circuit is configured so that the control voltage on the corresponding control node controls the turning off of the corresponding programming current.

16. The electronic apparatus according to claim 15, wherein, during the step of writing, the control unit controls the local selection circuits and the main selection circuits coupled to the selected memory cells through, respectively, a same local column-decoding signal and a same main column-decoding signal; and wherein each limiter circuit further comprises a reconfigurable flip-flop circuit coupled to the corresponding control node, the control unit being controllable so as to cause the reconfigurable flip-flop circuits to operate, during the writing step, in a first mode; and wherein, when operating in the first mode, each reconfigurable flip-flop circuit is configured to:

generate, on a respective output, a respective interruption signal, whose logic value depends on the control voltage on the corresponding control node, the logic value on the respective output being indicative of whether, during the writing step, an open bit occurred in the selected memory cell coupled to the corresponding program driver circuit, the corresponding limiter circuit being further configured to turn off the corresponding programming current based on the respective interruption signal;

wherein, when the control unit is configured to cause the reconfigurable flip-flop circuits to operate in the first mode, the control unit is further configured to:

detect the occurrence, during the writing step, of an open bit in any of the selected memory cells, based on the generated interruption signals;

wherein the control unit is further controllable so as to cause the reconfigurable flip-flop circuits to operate, after the writing step, in a second mode; and wherein, when the control unit is configured to cause the reconfigurable flip-flop circuits to operate in the second mode, the control unit is further configured to generate a pulsed clock signal; and wherein, when operating in the second mode, the reconfigurable flip-flop circuits are coupled in cascade, and each reconfigurable flip-flop circuit is configured to:

couple a respective input to the output of the following reconfigurable flip-flop circuit, so as to receive the logic value on the output of the following reconfigurable flip-flop circuit, the logic value on the output of the following reconfigurable flip-flop circuit being indicative of whether, during the writing step, an open bit occurred in the selected memory cell coupled to the program driver circuit which corresponds to the following reconfigurable flip-flop circuit;

receive the clock signal; and transfer the logic value on the respective input onto the respective output, with a timing which depends on pulses of the clock signal; and wherein the control unit is further configured to determine the program driver circuit coupled, during the writing step, to the selected memory cell in which an open bit occurred, based on the logic values on the output of the first reconfigurable flip-flop circuit of the cascade, during at least one of the pulses of the clock signal.

17. The electronic apparatus according to claim 14, wherein, for each program driver circuit, the corresponding subset of main bitlines includes a single corresponding main bitline; and wherein each limiter circuit comprises a corresponding switching element, which is coupled to the corresponding output node and to a corresponding control node, the switching element being configured to couple the corresponding output node to the corresponding control node, in response to the voltage on the corresponding output node overcoming the reference voltage, so as to cause a switching of a logic value of a control voltage on the corresponding control node; and wherein each limiter circuit is configured so that the control voltage on the corresponding control node controls the turning off of the corresponding programming current.

18. The electronic apparatus according to claim 17, wherein, during the step of writing, the control unit controls the local selection circuits and the main selection circuits coupled to the selected memory cells through, respectively, a same local column-decoding signal and a same main column-decoding signal; and wherein each limiter circuit further comprises a reconfigurable flip-flop circuit coupled to the corresponding control node, the control unit being controllable so as to cause the reconfigurable flip-flop circuits to operate, during the writing step, in a first mode; and wherein, when operating in the first mode, each reconfigurable flip-flop circuit is configured to:

generate, on a respective output, a respective interruption signal, whose logic value depends on the control voltage on the corresponding control node, the logic value on the respective output being indicative of whether, during the writing step, an open bit occurred in the selected memory cell coupled to the corresponding program driver circuit, the corresponding limiter circuit being further configured to turn off the corresponding programming current based on the respective interruption signal;

wherein, when the control unit is configured to cause the reconfigurable flip-flop circuits to operate in the first mode, the control unit is further configured to:

detect the occurrence, during the writing step, of an open bit in any of the selected memory cells, based on the generated interruption signals;

wherein the control unit is further controllable so as to cause the reconfigurable flip-flop circuits to operate, after the writing step, in a second mode; and wherein, when the control unit is configured to cause the reconfigurable flip-flop circuits to operate in the second mode, the control unit is further configured to generate a pulsed clock signal; and wherein, when operating in the second mode, the reconfigurable flip-flop circuits are coupled in cascade, and each reconfigurable flip-flop circuit is configured to:
  couple a respective input to the output of the following reconfigurable flip-flop circuit, so as to receive the logic value on the output of the following reconfigurable flip-flop circuit, the logic value on the output of the following reconfigurable flip-flop circuit being indicative of whether, during the writing step, an open bit occurred in the selected memory cell coupled to the program driver circuit which corresponds to the following reconfigurable flip-flop circuit;
  receive the clock signal; and
  transfer the logic value on the respective input onto the respective output, with a timing which depends on pulses of the clock signal; and
  wherein the control unit is further configured to determine the program driver circuit coupled, during the writing step, to the selected memory cell in which an open bit occurred, based on the logic values on the output of the first reconfigurable flip-flop circuit of the cascade, during at least one of the pulses of the clock signal.

19. The electronic apparatus according to claim 14, wherein the memory device further comprises a threshold generator circuit, which includes:
  a dummy current generator configured to inject a dummy current in a dummy node;
  a dummy main bitline and a dummy local bitline;
  a dummy memory cell including a resistor and coupled to the dummy local bitline;
  a dummy main selection circuit equal to the main selection circuits and electronically controllable so as to couple the dummy main bitline to the dummy node; and
  a dummy local selection circuit equal to the local selection circuits and electronically controllable so as to couple the dummy bitline to the dummy main bitline;
  wherein the threshold generator circuit is configured so that, during the writing step, the dummy memory cell is coupled to the dummy node through the dummy local selection circuit and the dummy main selection circuit, so as to be traversed by the dummy current; and wherein the threshold generator circuit is configured to generate a clamp voltage as a function of the voltage on a dummy sense node, the voltage on the dummy sense node depending on the voltage on the dummy main bitline; and wherein the reference voltage depends on the clamp voltage.

20. The electronic apparatus according to claim 19, wherein each limiter circuit comprises, for each main bitline of the corresponding subset of main bitlines, a corresponding switching element, which is coupled to the corresponding main bitline and to a control node of the limiter circuit, the switching element being configured to couple the corresponding main bitline to the control node, in response to the voltage on the corresponding main bitline overcoming the reference voltage, so as to cause a switching of a logic value of a control voltage on the control node; and wherein each limiter circuit is configured so that the control voltage on the corresponding control node controls the turning off of the corresponding programming current, and wherein the threshold generator circuit includes a voltage follower circuit which is configured to generate the clamp voltage based on the voltage on the dummy main bitline.

* * * * *

UNITED STATES PATENT AND TRADEMARK OFFICE
CERTIFICATE OF CORRECTION

PATENT NO. : 11,475,960 B2
APPLICATION NO. : 17/306266
DATED : October 18, 2022
INVENTOR(S) : Fabio Enrico Carlo Disegni It is certified that error appears in the above-identified patent and that said Letters Patent is hereby corrected as shown below:

In the Claims

Claim 1, Column 18, Line 31; delete "bit line" and insert --bitline--.

Signed and Sealed this
Sixth Day of December, 2022

*Katherine Kelly Vidal*

Katherine Kelly Vidal
*Director of the United States Patent and Trademark Office*